United States Patent [19]

McCollum

[11] Patent Number: 4,740,883
[45] Date of Patent: Apr. 26, 1988

[54] UNIVERSAL SOLID STATE POWER CONTROLLER

[75] Inventor: Patrick E. McCollum, Yorba Linda, Calif.

[73] Assignee: Rockwell International Corporation, El Segundo, Calif.

[21] Appl. No.: 893,058

[22] Filed: Aug. 4, 1986

[51] Int. Cl.[4] ............................................. G01R 19/00
[52] U.S. Cl. ....................................... 364/140; 307/26; 361/100; 364/184; 364/483
[58] Field of Search ............... 364/140, 483, 492, 184; 323/237–246, 283, 320–327; 361/3, 5–8, 13, 79, 86, 87, 90–92, 93, 100, 101, 115; 307/21, 22, 25, 26

[56] References Cited

U.S. PATENT DOCUMENTS

| | | | |
|---|---|---|---|
| 4,445,183 | 4/1984 | McCollum et al. | 364/483 |
| 4,538,231 | 8/1985 | Abe et al. | 364/483 |
| 4,541,058 | 9/1985 | Andow et al. | 364/483 |
| 4,665,355 | 5/1987 | McCollum et al. | 323/320 X |
| 4,672,501 | 6/1987 | Bilac et al. | 364/483 X |

Primary Examiner—Joseph Ruggiero
Attorney, Agent, or Firm—H. Fredrick Hamann; George A. Montanye; James F. Kirk

[57] ABSTRACT

A universal solid state power controller for controlling the application of a source voltage to a load comprising a semiconductor switch having a predetermined non-bounce switching characteristic. The switch is responsive to an operating signal for connecting the load to the source voltage. A control means has a microcomputer following a predetermined program. The control means is responsive to a command electrical signal and provides the semiconductor switching means operating signal. The microcomputer program has an ac subprogram for SSPC operation with a source voltage of sinusoidal character and a dc subprogram for SSPC operation with a source voltage of direct current character. A voltage selection circuit provides a logic signal of a first polarity to the microcomputer to direct the microcomputer to use the ac subprogram for SSPC operation with an ac source. The logic signal has a second polarity to direct the microcomputer to use the SSPC dc subprogram for operation with a dc source. A current rating selection circuit provides a logic signal to the microcomputer to direct the microcomputer to select a predetermined current rating for the power controller. The invention electrical switch provides a bounce-free closure of the conduction path from the alternating source voltage to the load in response to the command electrical signal. The closure corresponds with a first predetermined sequence of alternating source voltage crossing zero voltage. The invention switch interrupts the conductive path to the load without contact bounce, associated arcing in response to interruption of the command electrical signal.

18 Claims, 22 Drawing Sheets

DC SWITCH

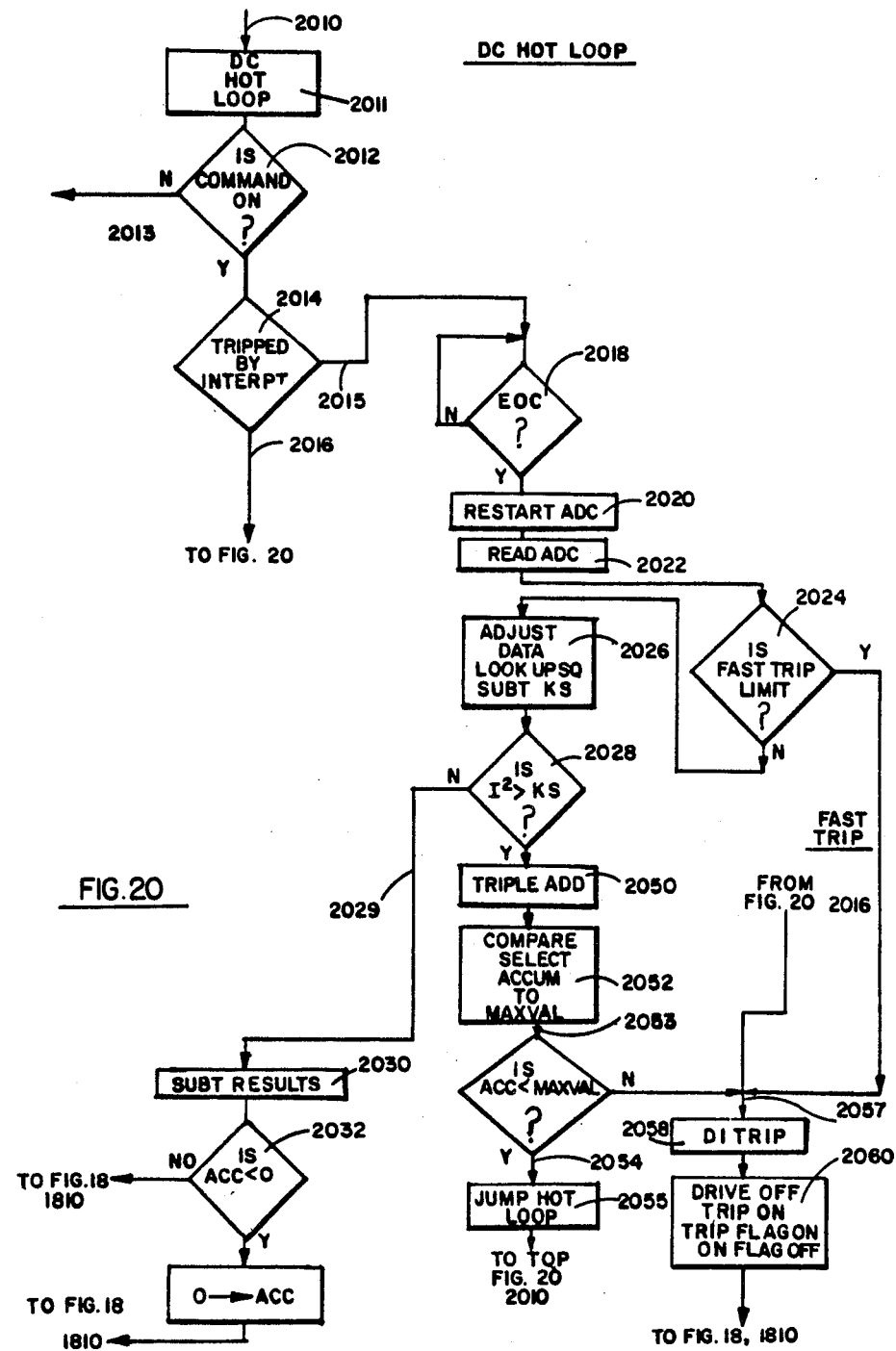

UNIVERSAL SOLID STATE POWER CONTROLLER

BACKGROUND OF THE INVENTION

1. Field of the Invention

This invention relates to the field of electrical switches and particularly to the field of remotely controlled electrical switches capable of interrupting the application of a source voltage to a load in response to an overload condition.

This invention relates more particularly to the field of solid state power controllers for ac (alternating current) and dc (direct current) service or solid state electrical switches such as solid state relays capable of detecting overload conditions and being able to interrupt the electrical service to the load automatically thereby preventing or limiting further damage to the service or load or lead wire and having the additional capability of being remotely resettable after clearing the overload condition. Typical applications for the invention universal solid state power controller include marine and aircraft as well as industrial applications requiring noise free closure and interruption of source power, compact size, extended switch life, low power dissipation and high reliability.

2. Description of the Prior Art

Electromechanical switching devices using solenoid driven means to transfer electromechanical contacts to apply a source voltage to a load, such as relays are well known. When coupled with an electromechanical circuit breaker, a relay provides a remotely controllable power control function capable of supplying ac or dc service to load via its closed contacts in series with an electromechanical circuit breaker. Electromechanical switching devices, such as relays, provide a very low voltage drop at the switch closure thereby affording low power dissipation.

As used in ac power control applications, mechanical contacts cannot conveniently be timed to apply power to the load as the source voltage crosses zero voltage, or to interrupt the application of power as the load current passes through zero so as to minimize transient disturbances. Mechanical wear, electrical arcing and slow response also limit the application of electromechanical devices to applications requiring low closing cycle rates.

The solid state relay is known to overcome the problem of applying a source voltage to a load as the source voltage crosses zero voltage. Solid state relays are also able to interrupt load current as the load current crosses zero. However, solid state relays introduce a substantial voltage drop at the point of circuit closure, thereby providing relatively high power dissipation in comparison to electromechanical switching devices. For this reason, solid state relays find their greatest application in controlling electrical service to loads requiring relatively low load currents.

Circuit breakers used to protect the electrical service for a load are typically complex mechanical devices that rely on magnetic circuits or thermally actuated means to detect an overload condition. Environmental effects such as vibration, moisture, temperature and age along with operational effects such as thermal and mechanical fatigue from past overload cycle experiences contribute to the degradation of these assemblies. Contact arcing that is sustained by a high voltage source as the contacts part to protect a circuit experiencing overload conditions, contribute to circuit breaker contact degradation, and produce transient noise disturbances that can contribute to error logic signal generation.

Solid state power controllers are typically designed for ac or dc applications. Original designs are prepared for each application, and in some cases, for each individual current range. Each design requires a separate investment of time and funds. The design of an solid state power controller for dc service is typically treated as the design of a product entirely different in function from the function of a solid state power controller designed for ac applications.

SUMMARY OF THE INVENTION

It is an objective of this invention to implement a remotely controllable electrical switch having the ability to independently detect over current conditions and to respond by interrupting the circuit so as to protect the electrical service to the load.

It is another major objective of the invention universal solid state power controller to eliminate the continuing need for individual controller designs for ac and dc applications and for particular current ranges.

It is a more particular objective of this invention to provide a single component design that supplies the control functions for switching ac or dc power to loads. In addition to controlling the application of electrical service to a load, the invention has the additional objective of establishing the current monitoring and trip schedule for any current range within a predetermined family of current ranges in accordance with a received predetermined logic signal command.

Another more particular objective of the invention is to provide the required control signals for a remotely controllable switch closure, and when directed to function as an ac controller, to exhibit the preferred features of a solid state ac-relay in response to a turn-on command of first applying a source voltage to a load as the source voltage crosses zero voltage, and to later respond to interruption of the turn-on command by interrupting the current path to the load as the load current crosses zero.

The invention universal solid state power controller provides the function of a remotely resettable solid state circuit breaker after detecting and independently interrupting electrical service to a load due to an overload condition.

Another more particular objective of this inventions to limit contact arcing and contact bounce as the invention electrical switch applies or interrupts electrical service to a load in response to a remote command or independently interrupts the service in response to an overload condition.

Yet another objective of this invention is to provide an electrical switch having the desirable noise free features of a solid state relay without having the customary practical load current limitations imposed by the switch power dissipation of solid state relays.

These and other objectives of the invention are realized in an electrical switch for controlling the application of a source voltage to a load under the control of a command electrical signal, resulting in the development of a load current in response to the command electrical signal comprising: a semiconductor switching means having a predetermined non-bounce switching characteristic.

BRIEF DESCRIPTION OF THE DRAWINGS

The invention will be further described as to an illustrative embodiment in conjunction with the accompanying drawings in which:

FIGS. 17 through 24 are flow charts for a program for the microprocessor in the universal solid state power controller.

DESCRIPTION OF THE PREFERRED EMBODIMENT

Figure 1:
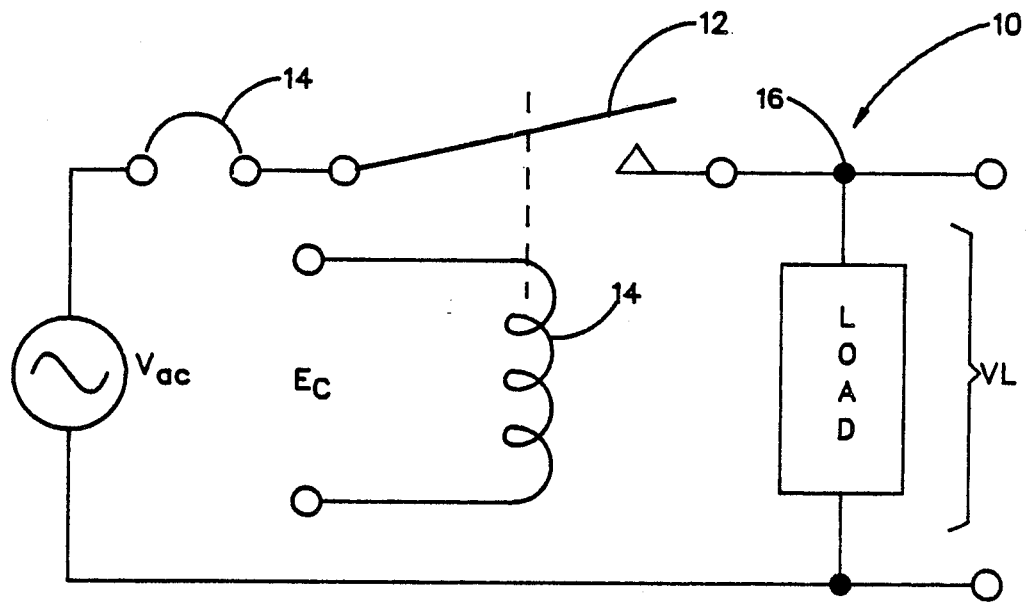
FIG. 1 is a schematic of a prior art electromechanical remotely controlled electrical switch.

Referring now to FIG. 1, there is shown a schematic of a prior art relay 10 applying an alternate source voltage Vac through a load contact 12 to a load, the voltage being designated by VL. The relay coil 14 is operated by electrical command signal Ec. This method of controlling the application of an alternating source voltage to a load has the following disadvantages: the rate of rise of voltage on connection 16 is uncontrollably high at the instant contact 12 closes, the time between the application of electrical command signal Ec to coil 14 and the closure of load contact 12 is relatively long and, to some extent non-uniform. In addition, load contact 12 is subject to wear as a result of arcing and mechanical wiping as load contact 12 opens and closes. When an overcurrent condition is detected by the thermal circuit breaker 14, it actuates to an open position, interrupting the application of power by source Vac to the load VL, thus creating a "tripped" condition.

Figure 2:
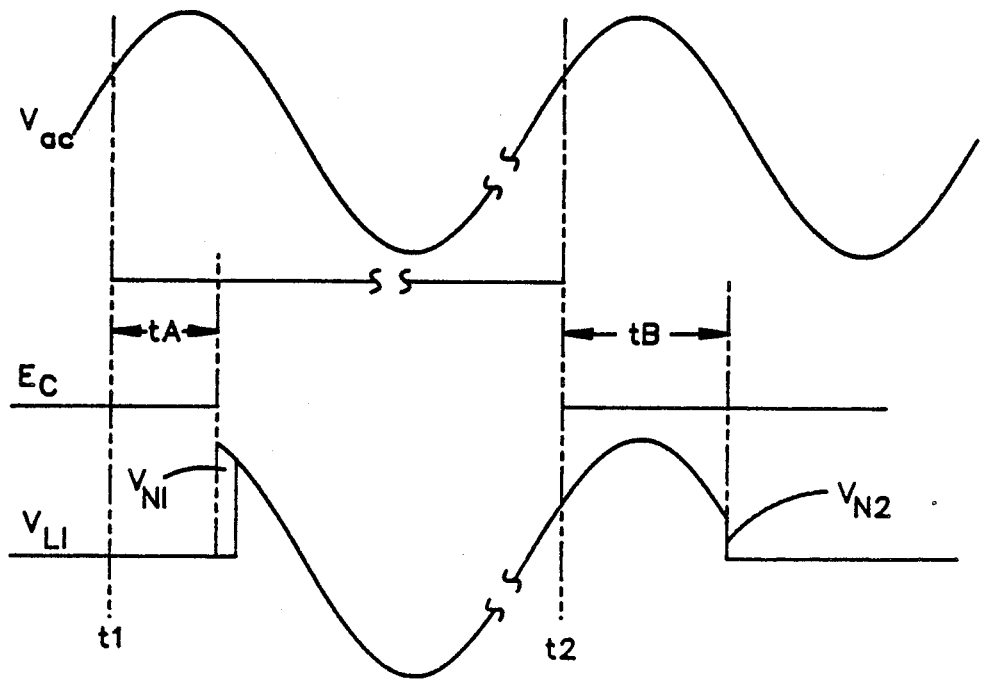
FIG. 2 depicts the applied source voltage waveform and the resulting voltage across the load resulting from an electrical control signal Ec applied to the coil of the prior art circuit of FIG. 1.

FIG. 2 shows the applied alternating source voltage Vac in relation to the electrical command signal Ec applied to the relay coil at an arbitrary point in time t1. The time required for the relay to transfer the load contact is shown as tA. As load contact 12 closes the voltage across the load V1 is shown rising abruptly as Vn1. The abrupt rise in voltage is accompanied by undesirable noise due to contact bounce. Electrical command signal Ec is shown ending asynchronously at time t2. Load contacts open after interval tB providing an abrupt drop in voltage Vn2. Voltage noise is present on circuit connection 16 at Vn2 due to contact bounce and arcing.

Figure 3:
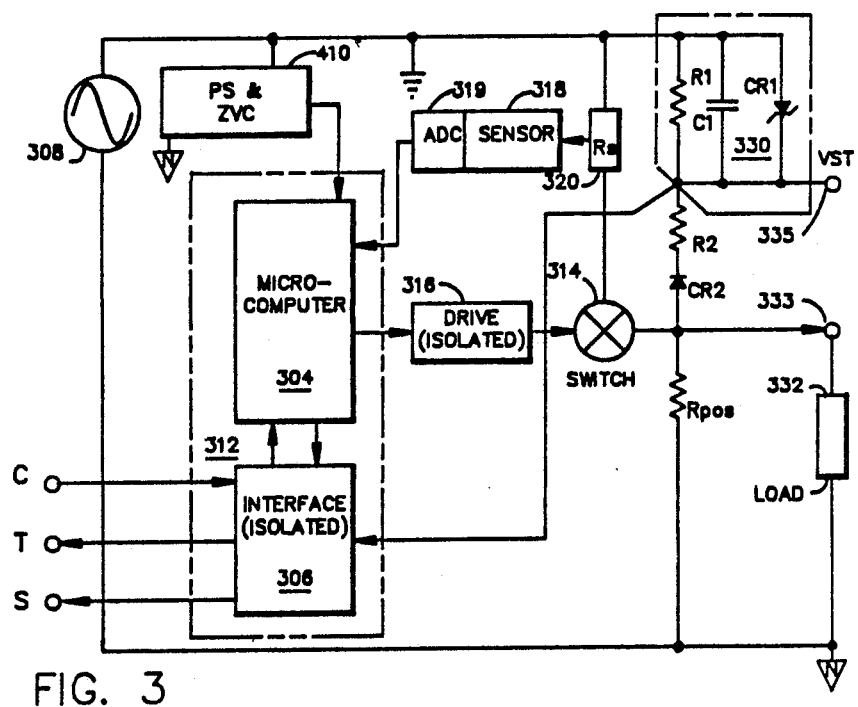
FIG. 3 is a block diagram of the universal solid state power controller used in an ac, single phase, electrical switch.
Figure 4:
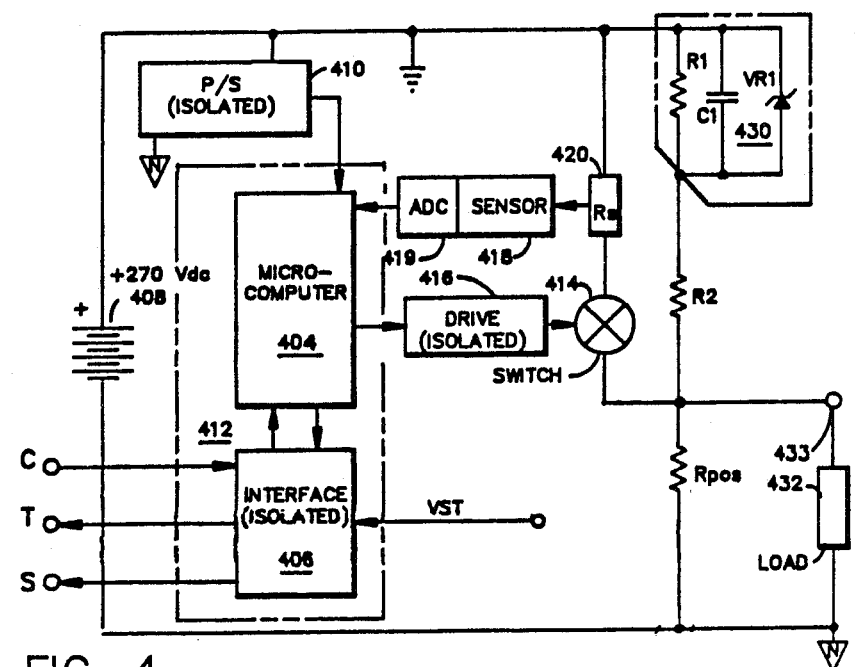
FIG. 4 is a block diagram of the universal solid state power controller used in dc electrical switch.
Figure 13:
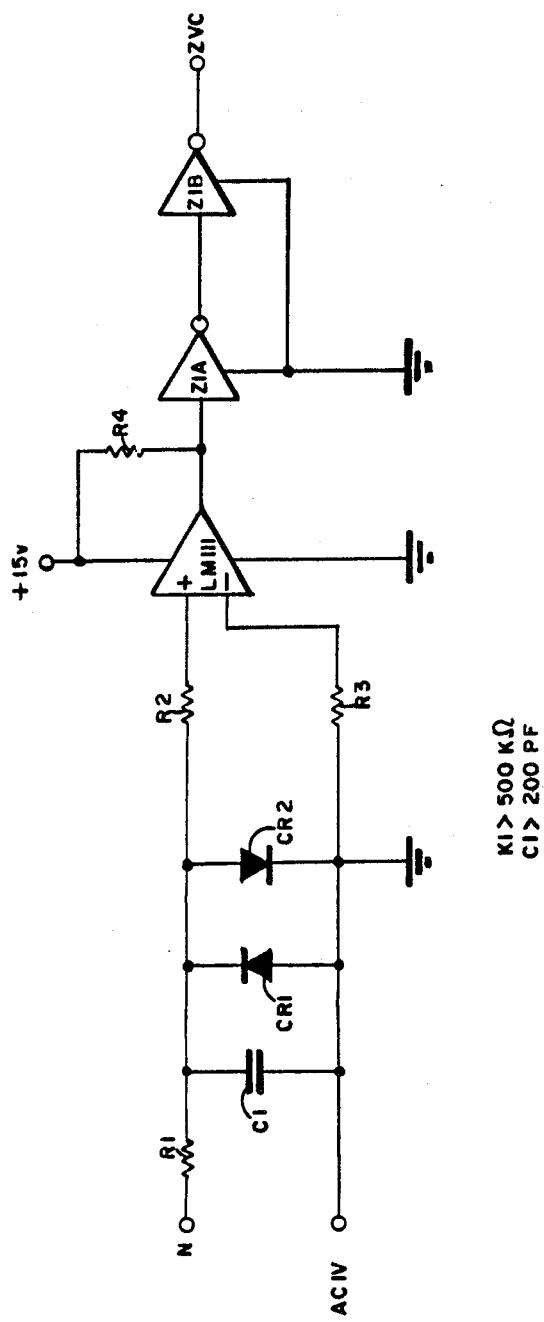
FIG. 13 is a schematic of an alternative zero crossing detector circuit.

FIG. 3 is a block diagram of an SSPC for ac mode operation and FIG. 4 is a block diagram of an SSPC for dc mode operation. The block diagrams have the following differences. FIG. 3 characterizes the power supply requirements for the MICROCOMPUTER block as being met by the PS&ZVC block 310. The ZVC term refers to a zero-voltage-crossing function within block 310. This function is characterized in greater detail in FIG. 10 in connection with the operation of FET Q3D via CR3, R9 and R10 to provide a zero crossing signal to Z4-39, the T1 input to the MICROPROCESSOR. The ZVC signal occurs as Q3D turns on as the line source voltage present on the ground plane, designated as AGND, swings negative with respect to the NEUTRAL line into the switch. FIG. 13 shows an alternative zero crossing circuit for producing signal ZVC.

Figure 9:
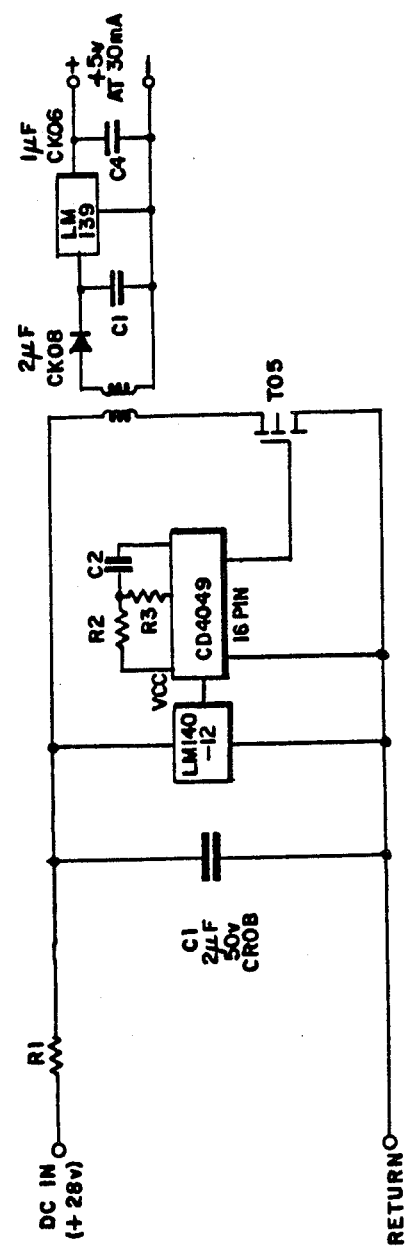
FIG. 9 is a schematic for an isolated dc source.

FIG. 4 does not show a ZVC term used in connection with an SSPC for dc applications within block 410. Block 410 is typically an isolated dc source such as that shown in greater detail in FIG. 9.

Figure 11:
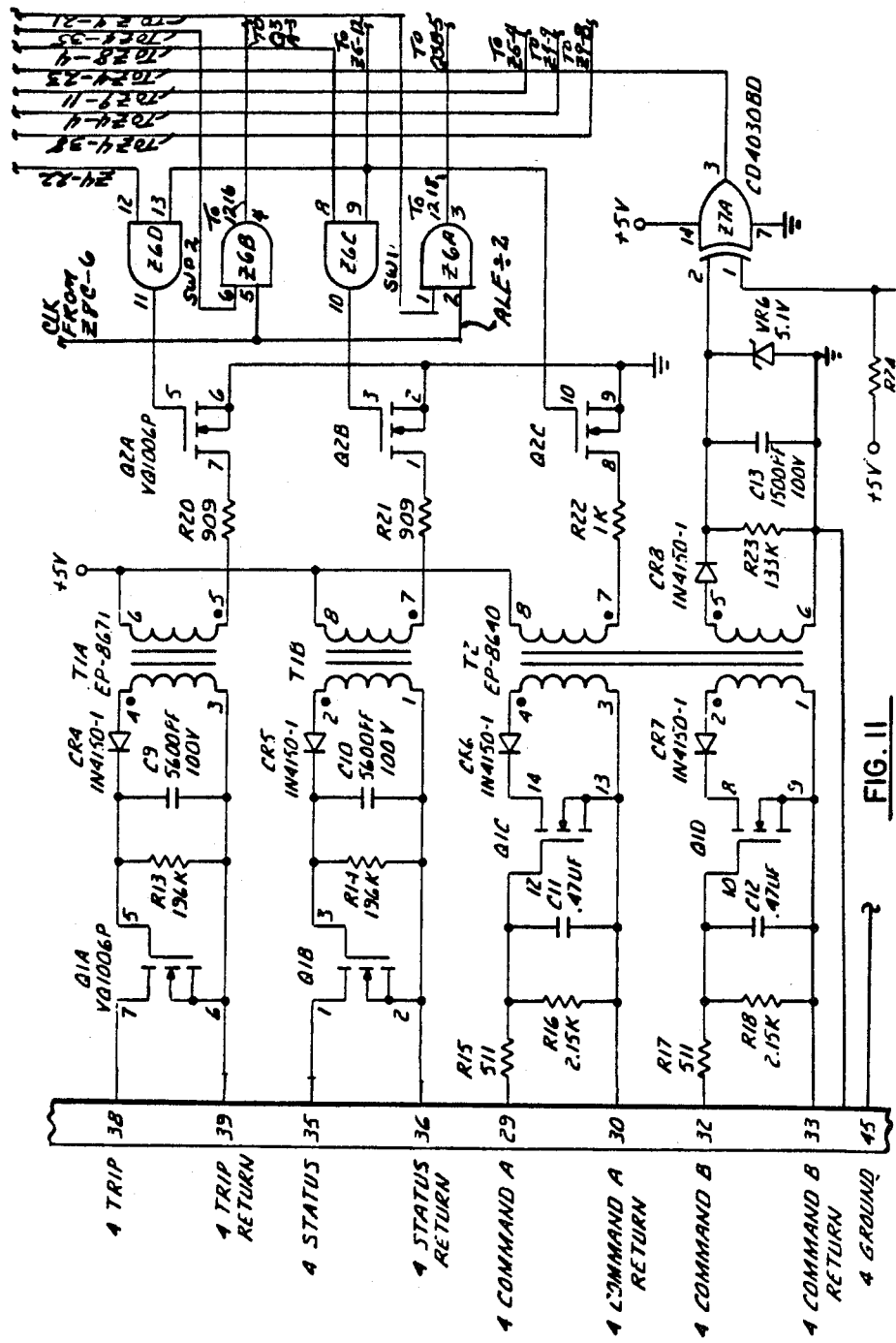

FIGS. 3 and 4 each show a phantom block designated as the SSPC core 312, 412. The core circuitry is essentially the same for both ac and dc applications. A single program is used for both applications. As the processor is installed, port lines to the processor are configured by board connections to characterize the service required of the microprocessor. INTERFACE blocks 306, 406 receive the COMMAND ELECTRICAL SIGNAL on the signal line designated "C". This function conditions the COMMAND signal and makes it available to MICROCOMPUTER block 406. Blocks 306, 406 also receive TRIP and STATUS signals from blocks 304, 404, respectively and make these signals available to external circuitry via signal lines T and S. FIG. 11 characterizes the circuitry of blocks 306 and 406 in detail.

FIGS. 3 and 4 also show a block designated as the DRIVE (isolated) block 316, 416. The circuitry within blocks 316, 416 will vary as required by the components within the respective SWITCH block 314, 414. FIGS. 3 and 4 each depict respective phantom blocks 330 and 430. The component connections required within these blocks are identical for both ac and dc applications; however, the component values for a dc application from a 270 Vdc service 408 will differ from those required for a 230 Vac, 400 Hz service 308.

Figure 12:
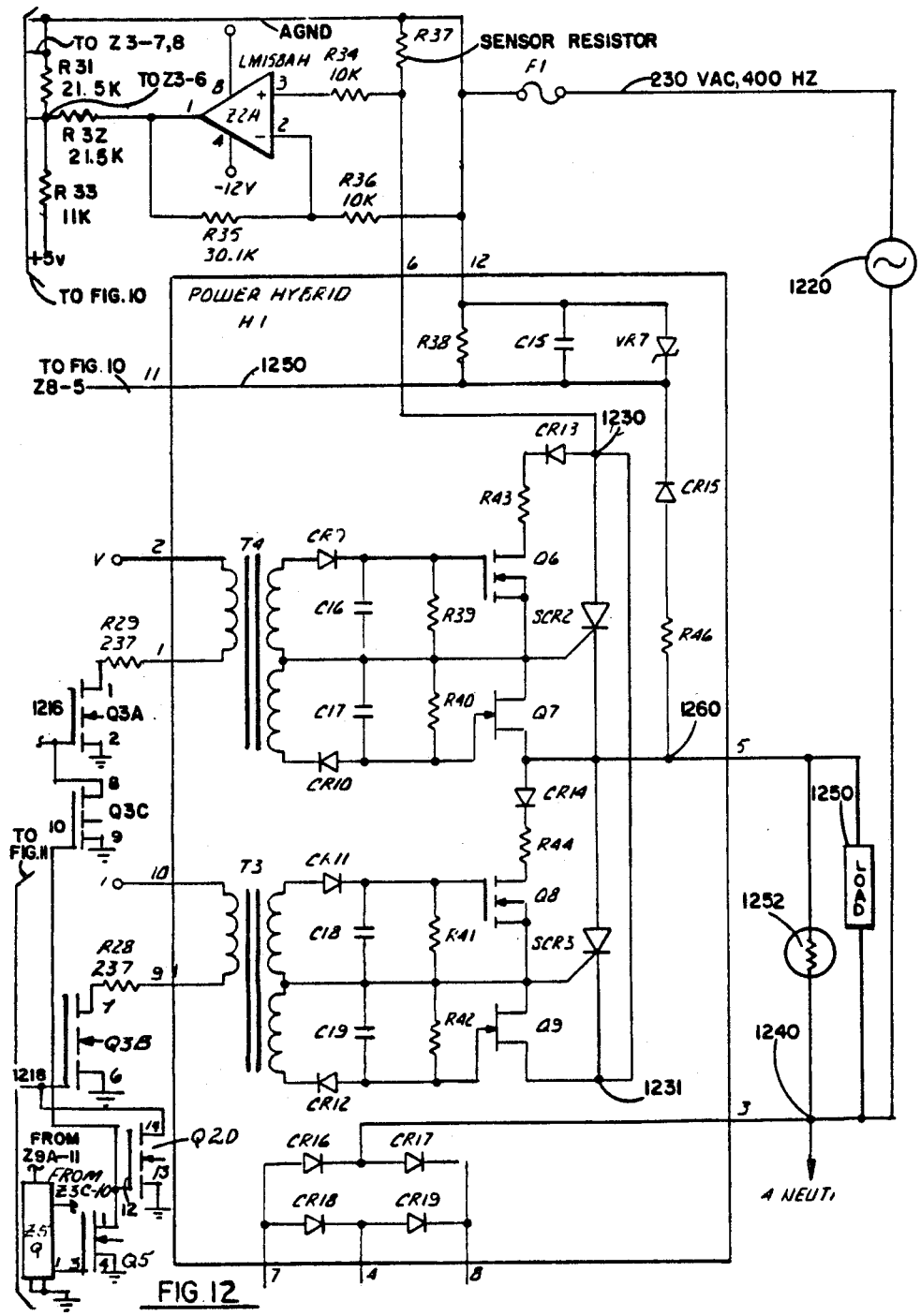

FIGS. 3 and 4 each have a block labeled $R_S$, 320, 420. All current passing from the service 308, 408, ac or dc, passes through this sense resistor. The respective SENSOR block 318, 418 amplifies, scales, and signal conditions the voltage across $R_s$ to provide a signal to the respective ADC block 319, 419 with the respective phantom SSPC CORE block 312, 412. Amplifier Z2A and the circuitry associated with it at the top of FIG. 12 provides a detail characterization of the circuitry of blocks 318, 418.

Figure 5:
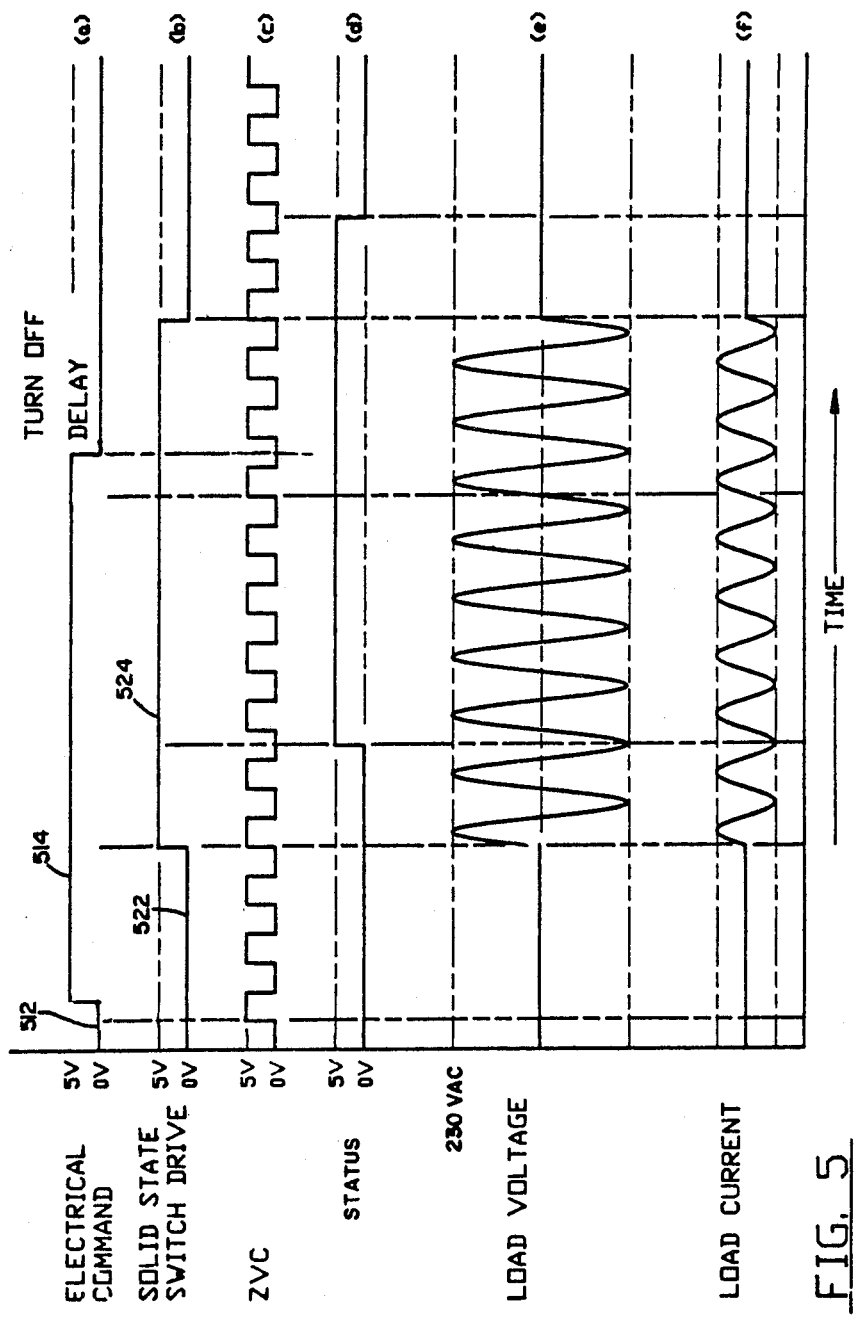
FIG. 5 depicts the signal and voltage waveform relationships for an ac, single-phase electrical switch showing a normal turn-on and turn-off sequence.

FIG. 5 is a timing chart for an ac mode SSPC showing normal operation. Waveform (a) characterizes the electrical COMMAND signal designated as signal "C" in FIGS. 3 and 4. Waveform (b) represents an operating signal, i.e. a solid state switch drive signal to close the ac switch. Waveform (b) represent signals such as the SWD1 and SWD2 signal that propagate from FIG. 10 to FIG. 11 and, subsequently to FIG. 12 to command the electrical switch of FIG. 12 ON. The operating signal is coupled via input lines to blocks 316, 416 in FIG. 3 and FIG. 4, respectively from microcomputer 304, 404.

Referring again to FIG. 5, waveform (c) represents the CVC signal or zero voltage crossing signal. The zero voltage crossing signal is generated by circuitry within phantom block 1054 in FIG. 10 or in the alternative, by a circuit such as the circuit of FIG. 13. Waveform (d) represents the status signal from the SSPC to external circuitry indicating that the ac mode SSPC has been commanded ON and is applying power to the load. Waveform (e) represents a typical 230 V ac 400 cycle source. Waveform (f) represents the load current developed in the load as a result of closure of the SSPC semiconductor switch means circuit such as that characterized as applying power from source 1220 to load 1250 in FIG. 12. The leading edge of waveform (a) is characterized as being asynchronous in its relationship to the ZVC signal. In addition, waveform (a) is observed to lead waveform (b) in time. The delay between the rise of waveform (a) and the rise of waveform (b) is a validation interval for the electrical command signal provided by the program followed by the microprocessor to ensure that a valid electrical command signal has been received and that the SSPC is not responding, in error, to a noise or transient condition on the electrical COMMAND signal line. A similar delay is provided by the program as the electrical COMMAND signal returns from its positive 5 V level to zero V. The operating signal, waveform (b) is observed to trail the fall of the electrical COMMAND signal by a predetermined time interval provided by the program. Removal of the electrical COMMAND signal is thereby validated.

Figure 6:
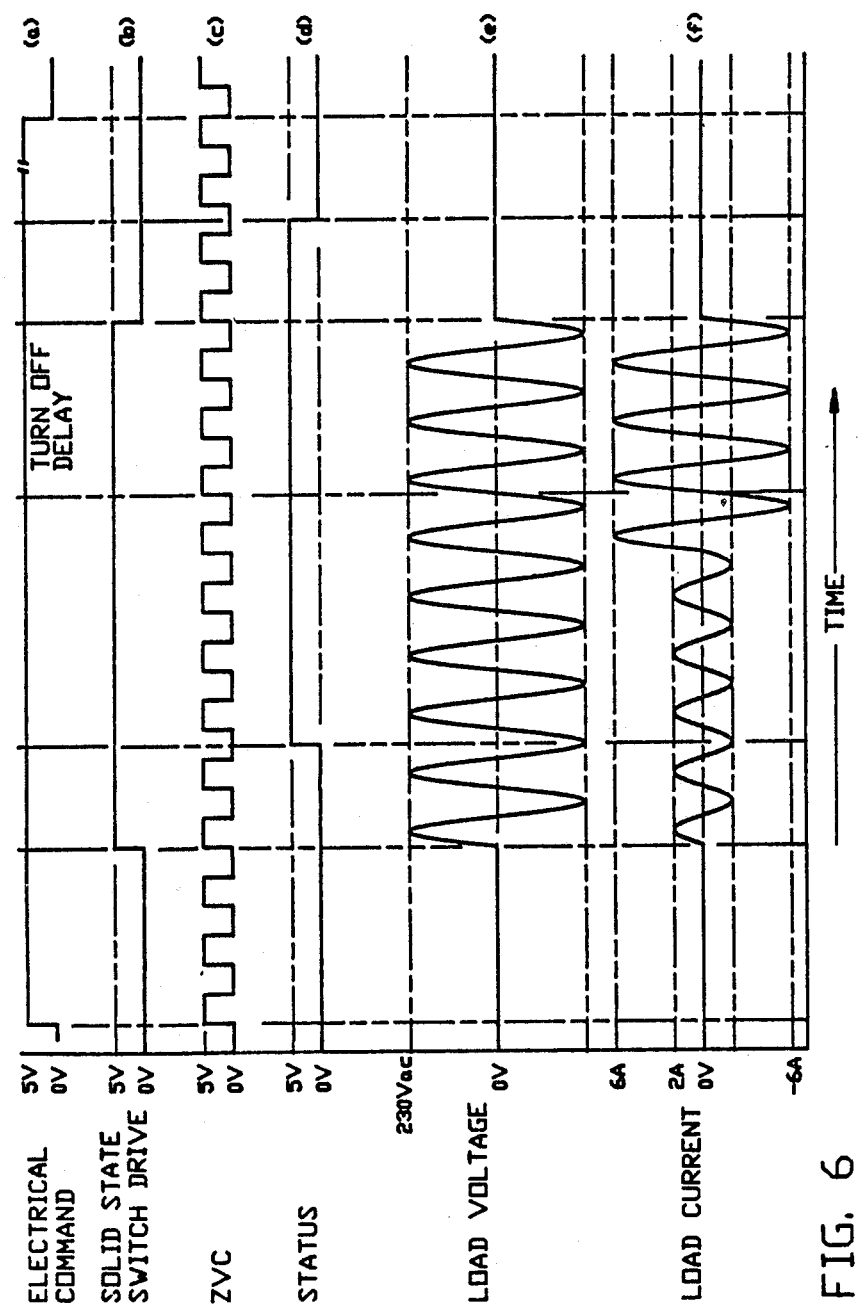
FIG. 6 depicts the signal and voltage waveform relationships for an ac, single-phase electrical switch showing a normal turn-on followed by an overload and then a turn-off in response to the load.

FIG. 6 characterizes operation of an ac mode SSPC as it responds to an overcurrent condition. Waveform (f) is observed to jump from a level of 2A to 6A in response to an overcurrent condition. Electrical COMMAND signal A remains true. However, waveform (e) representing the applied load voltage is removed in response to removal of waveform (b) under program control as a result of the overcurrent condition. Waveform (e) is not reapplied and at a later time, the electrical COMMAND signal, waveform (a) is reset. The STATUS signal, waveform (d) is removed shortly after removal of waveform (e).

AC SWITCH MEANS FLOW CHART DISCUSSION

Figure 10:
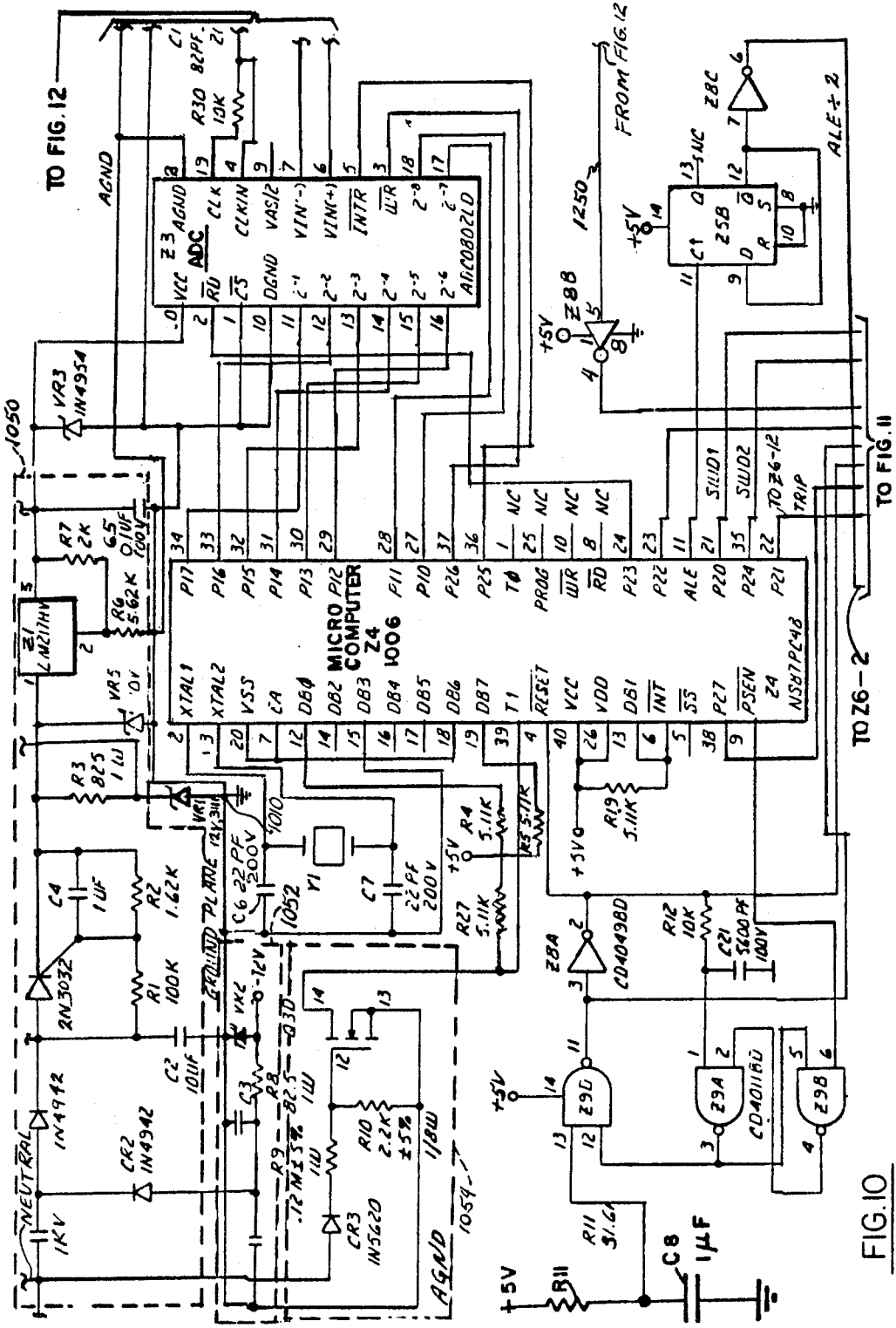
FIGS. 10, 11 and 12 are schematics of the universal solid state power controller in an ac switch application.

FIG. 12 is a schematic of a circuit suitable for operation as an ac switch means for coupling an ac voltage source such as 230 V ac, 400 Hz source 1220 to load 1250. The circuitry of FIG. 12 is used in connection with an SSPC characterized for ac operation only. Current passes from the source 1220 through fuse F1 through sense resistor R37 to common nodes 1230 and 1231. As the program cycles to the TURN-ON routine of FIG. 24 and to block 2455, the program turns the ON FLAG ON at block 2475 producing signals at the P20 and P24 port lines, Z4, 21 and Z4, 35 as shown in FIG. 10. Output signals SWD1 and SWD2 propagate from FIG. 10 via FIG. 11 to produce signals at the outputs of AND gates Z6 A and B, pins Z6-4 and Z6-3. These logic signals are chopped as a result of clock inputs to Z6-5 and Z6-6. The output signals from Z6-4 and Z6-3 pass to the gates of enhancement mode FETs Q3A, 1216 and Q3B, 1218 on FIG. 12. The logic signals on these gates are typically switching at a frequency of 200 KHz or greater. Operation of FETs Q3A and Q3B produce an isolated ac drive signal on the secondaries of T4 and T3. The isolated drive signals are rectified to produce positive and negative voltage levels. A positive level on the gate of Q6 turns Q6 ON, thereby completing a path from the node 1230 via CR13, R43 to the gates of SCR2 as the node 1230 swings positive with respect to neutral 1240. As the voltage on node 1230 rises, CR13 becomes forward biased and provides current via R43 and Q6 to pull the gate of SCR 2 positive, thereby firing SCR2. SCR2 is fired on each and every positive swing of voltage source 1230 by the drive signal to Q6 as applied.

In a similar manner, Q8 is turned on coupling the node 1260 to the gate of SCR3 via CR14, R44, and Q8. The gate of SCR3 is driven positive only at times when voltage source 1231 swings negative with respect to neutral. Therefore, the circuit of FIG. 12 drives SCR2 and SCR3 on during alternate halves of the ac power cycle to the load. Thermistor 1252 is a positive temperature coefficient thermistor characterized to increase its resistance as it heats. The purpose of thermistor 1252 is to provide a path from the switched service on node 1260 to neutral and then to power ground.

The negative levels fed to the gates of Q7 and Q9 turn these J-FETS off. In the absence of an operating signal, these J-FETS provide a conduction path from the respective SCR gate to cathode.

The operation of the low power isolated ac switch of FIG. 12 is more fully characterized in U.S. Pat. Application Ser. No. 740,465, titled "ISOLATED LOW POWER THYRISTOR GATE DRIVE CIRCUIT" U.S. Pat. No. 4,631,472, for inventors Brownrigg, Linder and McCollum, assigned to the common Assignee, Rockwell International Corporation and to which the reader is referred for a more complete discussion.

DC SWITCHING MEANS

Figure 14:
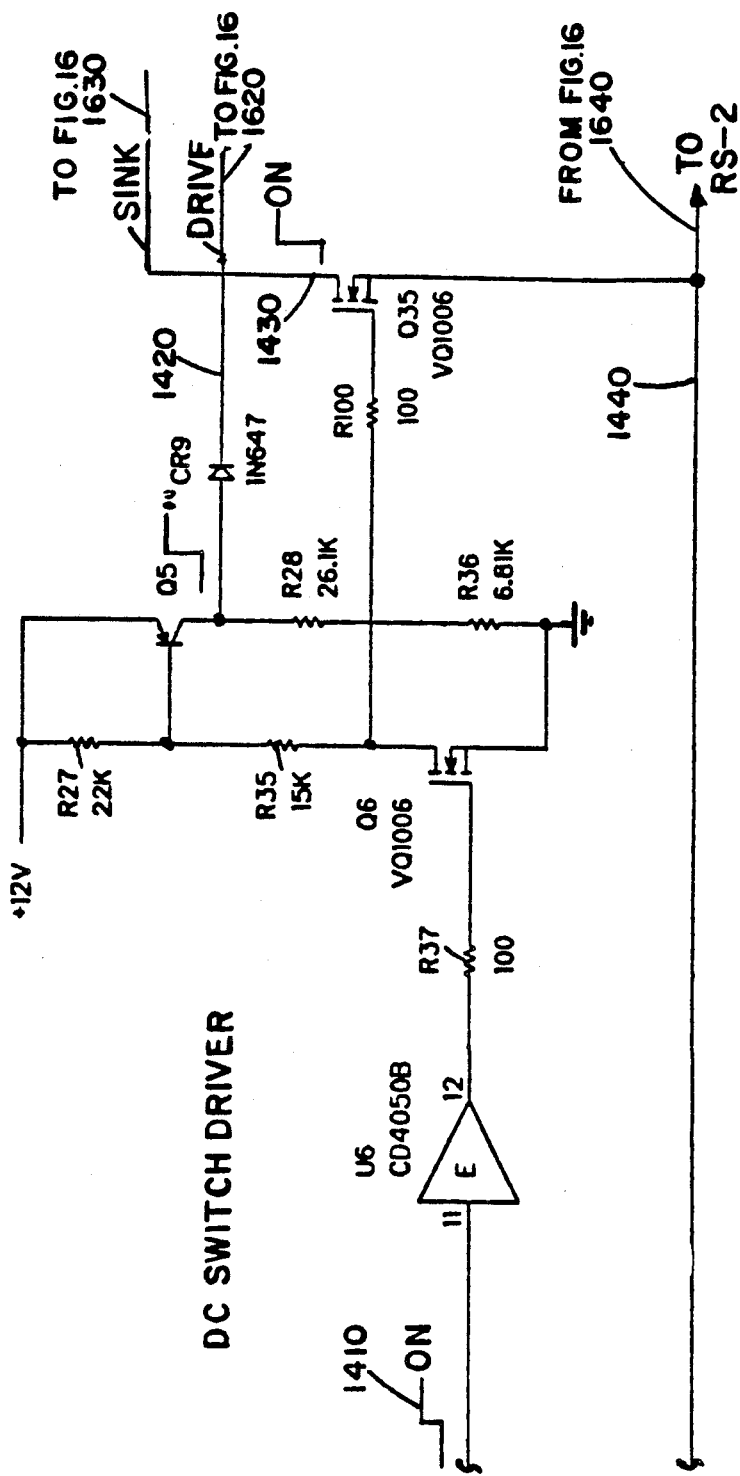
FIGS. 14, 15 and 16 are schematics of a dc switch semiconductor switching means.
Figure 15:
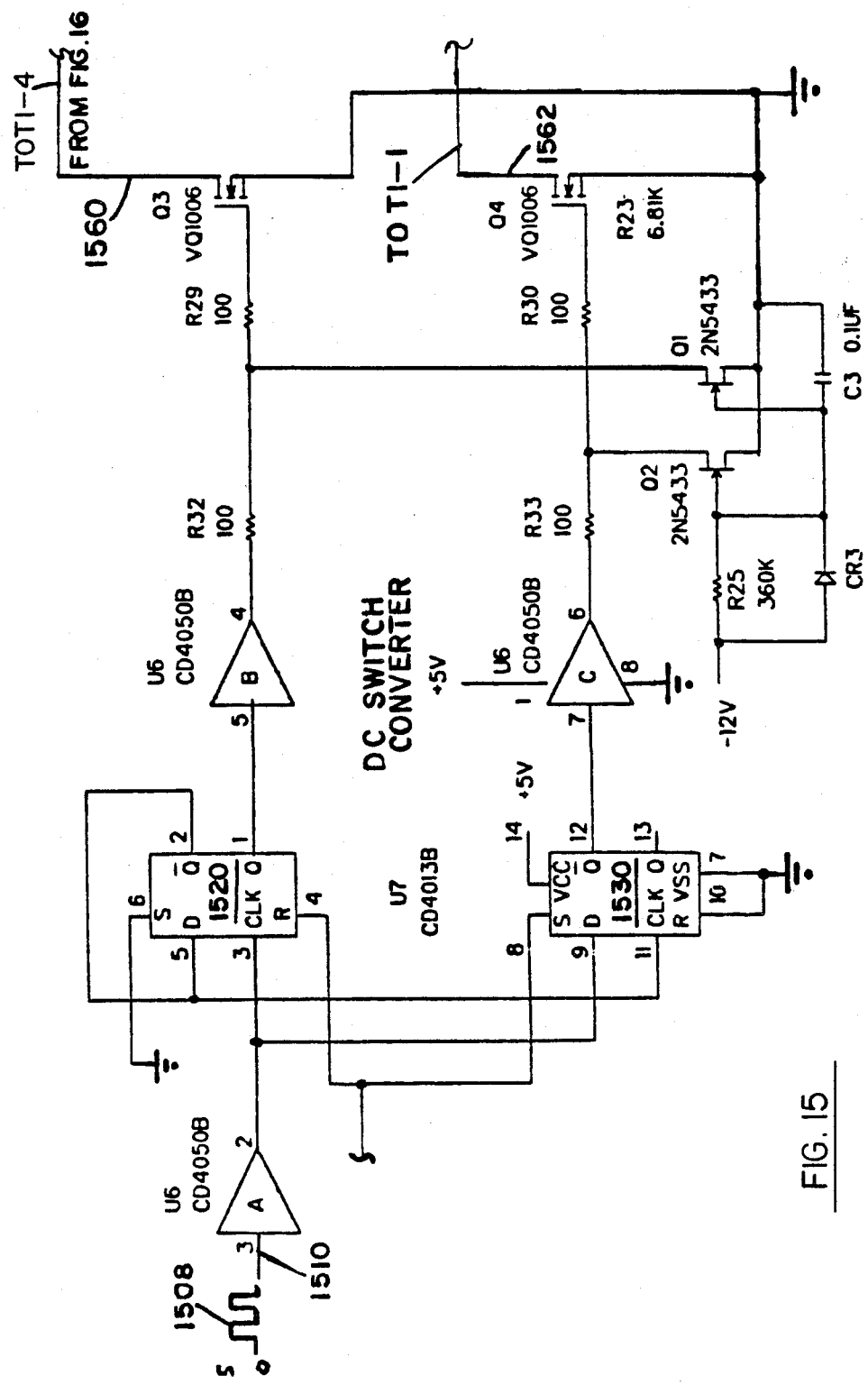
Figure 16:
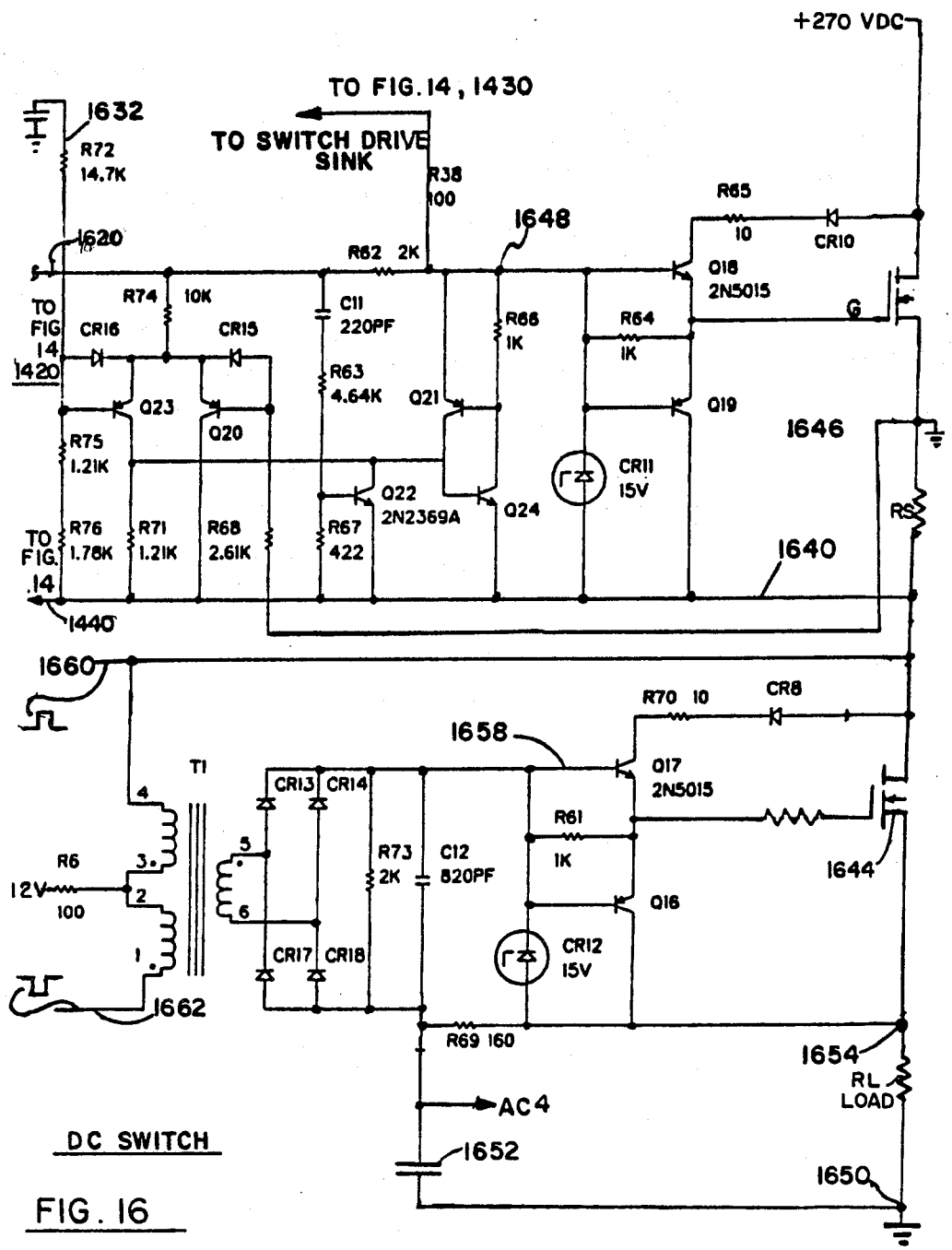

FIGS. 14, 15 and 16 form a dc switching means circuit for use with a +270 Vdc. The circuit of FIGS. 14, 15 and 16 are used with an SSPC configured for dc operation. The dc switch means of these figures has a dc switch driver, such as that shown in FIG. 14. In operation, the dc driver receives an ON signal such as that characterized by wave form 1410 at the input of U6 - 11. The ON logic signal 1410 is a +5 V logic signal similar to the signal SWD1 or SWD2 signal at P20 and P24 from the Z4 microprocessor on FIG. 10. As signal 1410 rises to a positive logic level, the output of buffer U6 also goes positive, turning on the Q6 FET. The turn-on of Q6 results in Q5 turning on and Q35 turning off. Q5 provides a positive 12 V drive signal via CR9 on signal line 1420 as Q35 opens releasing SYNC LINE 1430 from its connection to voltage reference 1440.

Referring to FIG. 16, the positive drive signal from FIG. 14, 1420 is applied to signal line 1620. Signal line 1620 rises abruptly to +12 V minus one diode drop.

SCR GATE BLANKING

NPN transistor Q22 is momentarily driven into conduction by the positive rise on signal line 1620 as this voltage change is coupled via C11 to the base of Q22. Q22 operates to momentarily short the base of Q24 to ground. The combination of Q21 and Q24 are connected to operate as an SCR equivalent, with the base of Q24 forming the equivalent of an SCR gate. As Q22 switches the base of Q24 to ground during the application of a control signal to signal line 1620, the SCR combination of Q21 and Q24 is momentarily disabled.

The Q22 circuit operates to reduce the sensitivity of the Q21 and Q24 two transistor group to high dv/dt rates of voltage change on signal line 1620.

DIFFERENTIAL COMPARATOR

Referring to FIG. 16, the dual PNP transistor network formed by Q23 and Q20 form a differential comparator. Transistor Q23 typically receives a precision reference voltage level at its base from a precision reference level source such as a three-terminal regulator (not shown) via R72, R75, and R76. The precision level on the base of Q23 is typically 2.7 Vdc. Q23 is typically off in normal operation and Q20 is typically on or in conduction. Q20 is normally biased into conduction via the path from the signal line 1620 when the DRIVE signal goes high via R74, the base to emitter junction of Q20, R68 and sense resistor RS back to return the voltage reference level 1640 which is common with the voltage reference level 1440 of FIG. 14. In this dc SSPC application, voltage is applied to load RL, connected to ac neutral 1650 as FETs 1642 and 1644 are commanded ON. Both FETs 1642 and 1644 are N-channel enhancement mode insulated gate power FETs having both drain to source voltage ratings in excess of 400 V.

Referring again to FIG. 16, FET 1642 is commanded ON by the positive rise in voltage on signal line 1620 via R62 and Q18 to the gate of FET 1642. Q18 provides as much current to its emitter from the +270 Vdc source via CR10, R65, and its collector to keep the emitter voltage one diode drop below the base voltage. Q18 therefore operates to provide a buffered positive drive signal to the gate of FET 1642. Conversely, PNP transistor Q19 provides a buffered negative drive signal to sync the gate of FET 1642 to reference potential 1640 in response to a drop in voltage on signal line 1620.

TOTEM-POLE DRIVER

The combination of NPN transistor Q18 and PNP transistor Q19 form a conventional totem-pole driver for the gate of FET 1642. This driver has the ability to rapidly drive the gate of FET 1642 positive or negative as required in response to a signal on signal line 1620.

ANALOG FAST TRIP

As current through FET 1642 rises in response to a reduction in load impedance, voltage develops across sense resistor RS at nodes 1646 with respect to 1640. Overcurrent operation will cause the voltage on 1646 to rise across resistor RS driving the base of Q20 in a positive direction via R68 from node 1646. As the current through sense resistor RS exceeds the rated limit of the dc SSPC, the voltage at node 1646 raises the base voltage on transistor Q20 to the point where Q20 turns OFF and where diode CR15 is forward biased raising the potential on the emitter of Q23 above the base potential of Q23 fixed by the reference source from 1632 to 2.7 Vdc. Q23 turns on in response to this condit1on, thereby developing a positive voltage on R71.

TRIP VIA SCR LATCH-UP

As the voltage on R71 rises and exceeds the base-to-emitter junction voltage of Q24, Q24 starts to conduct lowering the voltage on the base of Q21 to the point where the base-to-emitter junction of Q21 becomes forward biased. Q21 conducts turning on Q24 and Q24 regenerates the conduction of Q21 by providing additional gate drive for Q21. The combination of Q21 and Q24 therefore latch as an SCR combination clamping node 1648 to a voltage equivalent to 1 VBE+1 Vsat above the voltage of node 1640. The clamping operation of the Q21 and Q24 operate to immediately turn Q18 off and Q19 on, thereby connecting the gate of FET 1642 to a voltage level approximating 1 Vbe above the voltage of reference node 1640. When fired, current from R62 provides a limited holding current for the Q21, Q24 SCR latch.

From the operation thus far described, it is apparent that the circuit of FIG. 16 provides a fast turn-off, or TRIP function independent of microprocessor operation. Turn-off is achieved within a microsecond or two of load current exceeding the fast trip limit.

DC SWITCHING MEANS ISOLATED CONVERTER

Referring to FIG. 15, a gated clock signal such as that characterized by reference 1508 is supplied to the input of U6A at pin 3. U6 is a conventional non-inverting buffer amplifier and provides a buffered output gated clock signal at U6-2.

A gated clock signal that is present at times corresponding to the presence of an operating signal in the ON state such as the previously characterized SWD1 and SWD2 signals is available for dc SSPC operation at the outputs of the Z6A and Z6B AND gates of FIG. 11. Clock signal into the second input of the Z6 A&B AND gates is provided from the output of the Z8C inverter on FIG. 10 and the divide-by-two flip flop Z5B in response to the ALE output on Z4-11.

Referring again to FIG. 15, clock signal 1508 is buffered and is applied to the clock inputs of the U7 D-flip-flop 1520, 1530. These "D" flip flops provide symmetrical outputs to non-inverting amplifiers U6B and U6C. Outputs from these amplifiers are supplied to the gates of FETs Q3 and Q4, respectively. Q3 and Q4 cycle ON and OFF in alternate time intervals at a clock rate in excess of 200 KHz. The drains of FETs Q3 and Q4 are coupled to opposing ends of center tapped primary winding T1-4 and T1-1 of transformer T1 shown in FIG. 16 and designated as 1660 and 1662, respectively. The primary center tap is powered via R6 from a +12 V source.

Alternate and symmetrical switching of Q3 and Q4 in combination with the +12 V applied to the center tap of the T1 primary via R6 results in an ac switching voltage on the secondary T1 at pins T1-5 and T1-6. Diodes CR13, CR14, CR17, and CR18 form a bridge rectifier for applying a positive voltage to the base of Q17 and to the base of Q16 when the lower FET 1644 is commanded ON to apply dc power to the load 1650. Resistor R69 and capacitor 1652 cooperate to limit the rate of rise of voltage applied to load 1650. As lower FET 1644 turns ON and raises the voltage on load 1650, current passes from node 1650 to node 1656 via R69, creating a positive to negative voltage drop across R69 as capacitor 1652 is charged. As the voltage ON node 1654 rises to a level approaching the combined voltage of the voltage on capacitor 1652 and the voltage on capacitor C12, the total instantaneous absolute voltage on node 1658 limits the voltage difference that Q17 can develop between the gate and source of FET 1654; thereby, limiting the rate of rise of voltage on load 1650. The combination of R69 and capacitor 1652 provide a limit on how quickly voltage can be removed from the load thereby limiting the negative dv/dt rate across the load 1650. By limiting the positive and negative dv/dt rates across load 1650, the invention circuit limits capacitively coupled noise between the distribution lines from the dc SSPC to the load 1650 and return.

Figure 8:
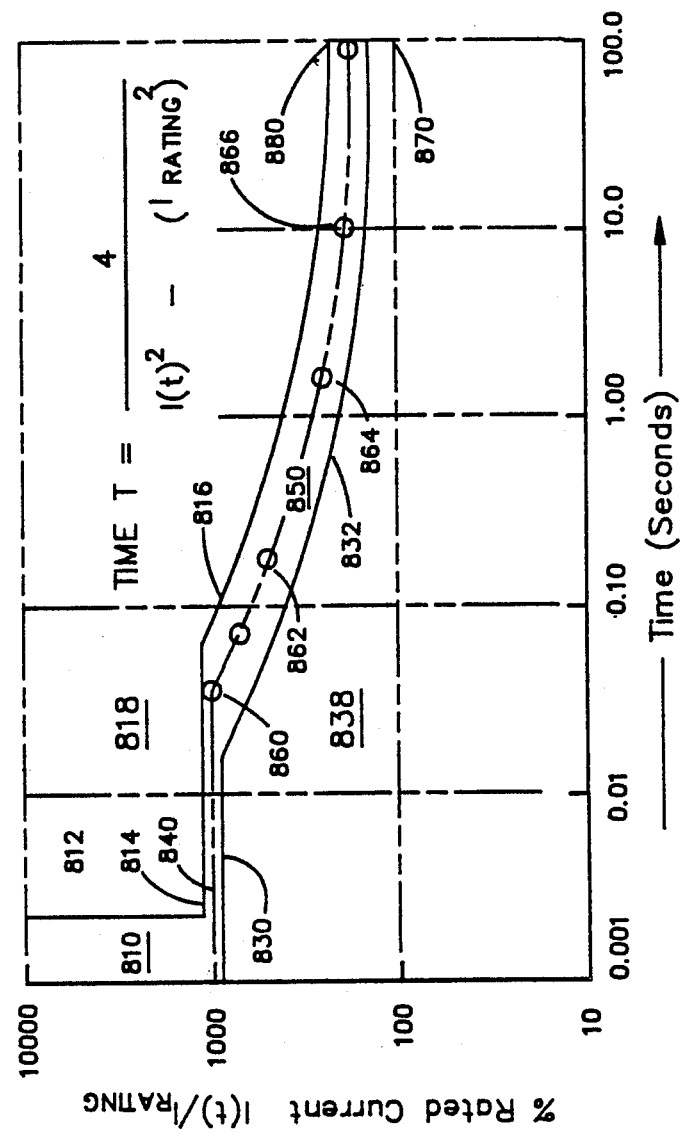
FIG. 8 is a typical solid state power controller trip curve.

FIG. 8 characterizes a typical SSPC trip curve. The horizontal axis is mapped on a five cycle logarithmic scale representing time in seconds and the vertical axis is mapped on three cycle logarithmic scale representing percent of rated current from 1% to 10,000%. Region 818 on the chart bounded by line 812, 814 and curve 816 represents an area in which the SSPC is open or TRIPPED and is not applying power to the load. Region 838 bounded by line 830 and curve 832 represents a region in which the SSPC is closed or commanded ON in response to the Electrical Command Signal. Regions 810, 840 and 850 represent indeterminate conditions for the SSPC. FIG. 8 is characteristic of the trip curves specified by SSPC users, such as government and industrial entities. The subject invention is capable of being configured to meet the requirements of a variety of trip curves similar to FIG. 8 without the necessity for programming. In addition, the invention SSPC eliminates the requirement for programming an SSPC for each particular application, such as for ac applications or for dc applications.

Data points 860, 862, 864 and 866 represent the time for trip required at particular rated current levels produced by the algorithm provided by the invention flow chart appearing in FIGS. 17 through 24, inclusive. For example, data point 860 indicates that at approximately 700% of rated current, the invention SSPC will trip in approximately 0.1 seconds. The data points plotted in FIG. 8 depend from the functional relationship $$T = 4/(I^2) - (1.2 * I_L)^2)$$

where $I_L$ represents the rating of the SSPC, i.e. the 100% load current for which the SSPC is rated. I represents the instantaneous current. The constant 4 is a constant selected to represent a particular $I^2*T$ rating. Other $I^2*T$ ratings are obtained by using a constant other than 4. Using 4 produces the curve of FIG. 8 which resembles the curve for a thermal electric circuit breaker. The data points of FIG. 8 are obtained by selecting a value for $I_L$, such as 2 for a 2 amp rating, and inserting that value in the previous equation. The equation is then solved for a number of values of I, a new value of T being obtained for each value of I substituted in the equation. values of T obtained for each corresponding value of I are then listed in tabular form and then plotted on the appropriate log log paper to obtain the curve of FIG. 8.

SIMPLIFIED SSPC FLOW DIAGRAM

Figure 7:
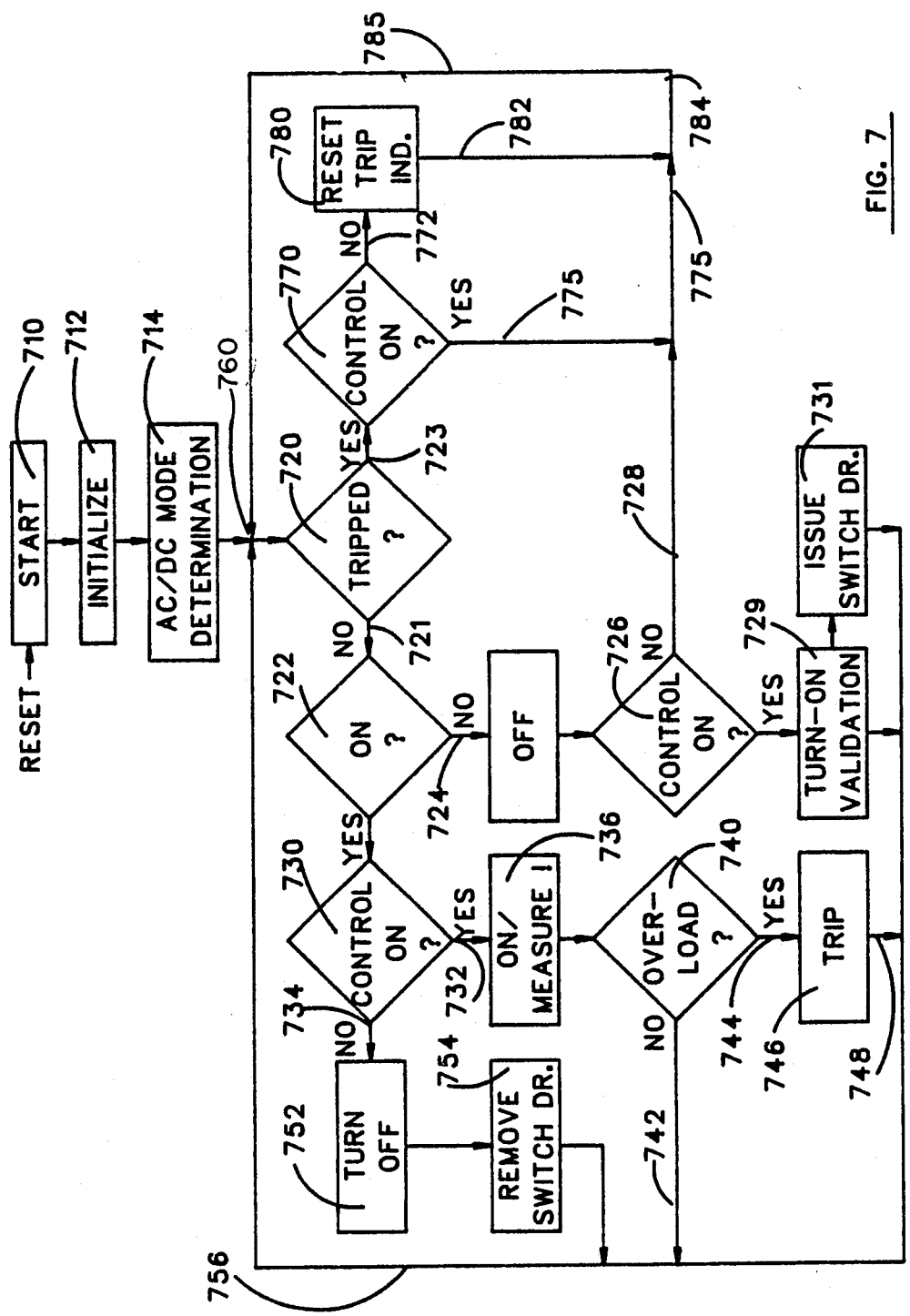
FIG. 7 is a simplified solid state power controller flow diagram.

FIG. 7 characterizes a simplified overview of the SSPC program. This program represents a generalized overview of a program to control the operation of an ac or dc solid state power controller. The microcomputer of FIGS. 3, 4, and 10, operating a program characterized by the block diagram of FIG. 7, or more particularly by the block diagram of FIGS. 17 through 24, represents a control means for SSPC characterized for ac or dc operation.

Several loops are followed as the program advances through this program. For the purpose of establishing an overview of these loops, titles of the loops will first be listed and a brief discussion of the path of each loop plus the functional significance of each loop will be provided.

The respective SSPC flow diagram loops are titled:

1. NORMAL TURN ON
2. IDLE WHILE ON
3. NORMAL TURN OFF
4. IDLE WHILE OFF
5. RESET FROM TRIPPED CONDITION
6. TRIP FROM A NORMAL ON CONDITION

Block 710, 712 and 714 characterize the normal initialization sequence that takes place each time power is applied to an SSPC controlled system. The start block typically involves clearing registers to be used, the initialized block 712 represents the steps of loading constants into registers, as required and the AC/DC mode determination block 724 represents the steps of determining if the unit is configured to switch AC or DC power.

NORMAL TURN-ON

The program advances to decision block 720, titled "TRIPPED?". A determination is made in this block if the unit has been tripped in the past. If the unit has not been tripped, the program advances via path 721 to decision block 722 titled "ON?". This block represents the step of determining if the COMMAND signal is ON. If the COMMAND signal is not ON, i.e. signalling that the SSPC should not apply power to the load, the program advances via path 724 to block 725 titled "OFF". This block represents the step of resetting all drive discretes and internal flags to remove power from the load if it is applied and to establish a status signal that indicates that power is not applied to the load. The program advances to decision block 726 titled "COMMAND ON?" If the command signal is now on, signalling that power is to be applied to the load, the program advances via path 727 to block 729 titled "TURN ON VALIDATION". The TURN ON VALIDATION block represents the process of verifying that the COMMAND signal remains true for a predetermined time interval, such as five milliseconds. The program then advances to block 731 titled "ISSUE SWITCH DRIVE". This block represents the steps of setting the appropriate port lines to achieve turn-on of the ac or dc switch. The program then returns via path 750, 756 to the normal entry point 760 at decision block 720.

IDLE WHILE ON

The IDLE WHILE ON sequence is represented by a path from decision blocks 720 to 722 to block 730 titled "COMMAND ON?". The program advances from decision block 730 via 733 to block 736 titled "ON/MEASURE I". This block represents the step of measuring the value of the current passing through the load. The program advances from block 736 to decision block 740 titled "OVERLOAD?". This decision block determines if an overload condition exists. Under normal conditions, an overload condition will not exist and the program will advance via path 742 to 756 and back to the normal entry point at 760.

NORMAL TURN-OFF

The NORMAL TURN-OFF sequence commences at the normal entry point 760, via 720 to decision making block 722. A determination is made that we have been ON and the program advances via path 726 to decision making block 730, titled "COMMAND ON?". At this point, a determination is made that the COMMAND signal is not ON and the program advances via path 734 to block 752 titled "TURN-OFF VALIDATION". After determining that the COMMAND signal has been OFF for the required time interval, the program advances to block 754 titled "REMOVE SWITCH DRIVE". Block 754 characterizes the steps required to set external ports to obtain removal of power from the load and correction of the status indication to indicate that power is no longer applied to the load. Subsequent to leaving block 754, the program advances via path 756 to the normal entry point at 760.

IDLE WHILE OFF

If the switch has not been commanded ON and if a command signal is not present and a trip has not occurred, the program advances via decision block 720, to path 721, to decision block 722 titled "ON?". After determining that the SSPC is not ON, the program advances path 724 to block 725 titled "OFF". The OFF block represents the step of initializing all discretes as required to insure that power is not applied to the load and that the status signal from the SSPC is in the correct state. The program advances from block 725 to decision block 726 titled "COMMAND ON?". After determining that the COMMAND signal is not true, the program advances via path 728, 775, 784, 785 to the normal entry point at 760.

RESET FROM A TRIPPED CONDITION

Referring to FIG. 7, this sequence commences from the normal entry point to decision block 720 titled "TRIPPED?" if determination is made that the conditions for a trip have occurred at some point in the past. The program advances from decision block 720 to decision block 770 titled "COMMAND ON?". If the COMMAND signal is still true indicating that the unit has not been reset, the program advances via path 774, 775, 784, 785 to the normal entry point at 760. If, on the other hand, a determination is made that the COMMAND signal has been reset, signalling that the SSPC has reset, the program advances from decision block 770 via path 772 to block 780 titled "RESET TRIP IND". Block 780 signifies the steps required to reset the required internal flags and external port lines to achieve idle operation.

INITIAL TRIP FROM A NORMAL ON CONDITION

As described above, if the SSPC has been ON and has not been tripped, the program cycles from decision blocks 720 to 722, to 730, to block 736 where the current is neasured. The program then advances to decision block 740 titled "OVERLOAD?". If a determination is made that the unit has been overloaded, the program advances via path 744 to block 746 titled "TRIP". Block 746 represents the step of setting all required external discretes and internal flags to accommodate removal of power from the load and production of a trip indication from the SSPC. The program exits block 746 via path 748, 756 to the normal entry point at 760.

INITIALIZATION AT TURN-ON

Figure 17:
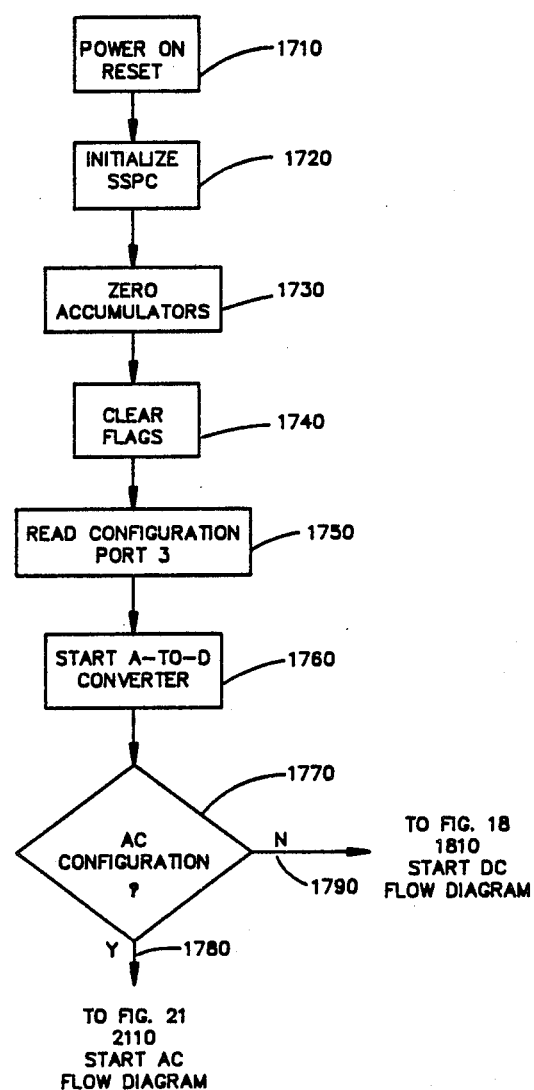

FIG. 17 is a first flow-chart sheet in a series of eight that describe the operation of the SSPC. The POWER ON RESET block 1710 characterizes the operational state of the microcomputer (FIG. 10, 1006) during the initial power-up sequence. Referring initially to FIG. 10, as power is first applied to the SSPC, capacitor C8 is initially discharged forcing the Z9D-13 NAND gate input to be initially low. A low on Z9D-13 forces the output of this gate at Z9D-11 to be high and this level is fed to the Z8A-3 inverter input. An initial high into inverter Z8A-3 forces its output Z8A-2 to be low. The low state out of inverter Z8A-2 discharges capacitor C21 via R12.

The R12, C21 network has a time constant of 56 microseconds. The time constant of R11 and C8 is 31.6 milliseconds. The discharge of C21 can be regarded as instantaneous in comparison to the charge time required to charge C8 above +2.5V. A low value on C21 forces the Z9A-3 NAND gate output to be high for as long as C21 remains discharged. After initial application of power, capacitor C8 charges via current from R11. As the voltage on Z9D-13 crosses the input voltage threshold of the NAND gate Z9D, the output of Z9D-3 goes from a high to a low. Inverter Z8A provides a low to a high transition out of inverter pin Z8A-2. Inverter Z8A low to high transition is fed via R12 to charge and raise the voltage on C21.

A high into NAND gate Z9A-1 forces the latch flip-flop formed by Z9A and Z9B to assume a stable state for system operation with output Z9A-3 high, Z9D-11 being low and with inverter output Z8A-2 into the RESET term into pin 40 of the microcomputer 1006 to be high. The interval during which the input to pin 40 remains low at turn-on is therefore controlled by the values of R11 and C8. The values of R11 and C8 are typically selected to provide a low state pulse into pin 40 of the microcomputer 1006 that lasts for at least twenty milliseconds, a time period judged to be sufficient to allow power to the microcomputer to stabilize to be within the manufacturers nominal operating range value.

A low into pin 40 of the microcomputer 1006 prevents the microcomputer from operating and forces all of its outputs into predetermined states acceptable for an initialization period prior to operation.

Referring to FIG. 17, as the input to pin 40 of the microcomputer rises from a low to a high at the end of the POWER ON RESET interval, under the control of R11 and C8, the program microcomputer begins operation by advancing to the INITIALIZE SSPC block 1720. Block 1720 is meant to indicate the entry or start point for particular initialization operations described by blocks 1730 through 1760.

Initialization proceeds as the program advances. The program advances to block 1730 to zero or clear RAM and all accumulators prior to use. BLOCK 1740 represents the step of clearing all internal state monitored flags. The program next advances to the READ CONFIGURATION PORT 3 block 1750 which represents the step of determining if the SSPC will operate as an ac or dc SSPC.

Port 3 is represented by the DB0 through DB7 lines to microcomputer 1006 in FIG. 10. The DB7 line is used to designate ac operation when its signal level is high. The selection of the required signal level is made at the time that the microcomputer is assembled onto the SSPC circuit board by providing, in the alternative, either a conventional pull-up resistor such as R5, 5.11K shown in FIG. 10 between +5 V and pin 19 to obtain a fixed high signal level for ac operation or a connection between pin 19 and the DGND level 1010 to obtain a fixed low signal level to select "dc" operation. A preprogrammed microprocessor is used. Since only one program is used for "ac" and "dc" applications, a board mounted switch or other means for selecting a high or low signal level at pin 19, DB7 are anticipated as equivalents of but less reliable than the above described circuit for FIG. 10 in which microprocessor pin 19 is seen to be wired high to +5 V thereby selecting ac operation.

The DB0 through DB7 inputs to the 8748H microprocessor 1006 by INTEL CORP. of Santa Clara, CA represent a true bi-directional port which can be written or read synchronously using the RD, WR strobes. The DB0 through DB7 port lines can also be statically latched.

Referring to FIG. 17, after reading the configuration of PORT 3 at block 1750, the program advances to block 1760 and starts the A-TO-D CONVERTER. This component is typically an ADC0802LD component by the NATIONAL SEMICONDUCTOR CORPORATION of Santa Clara, CA. The A-TO-D converter is represented on FIG. 10 by Z3. The A-TO-D converter is started by a signal from P26 at Z4-37 to Z3-3. This signal is issued from port 2, line 6 of microprocessor 1006.

The pulse into Z3-3 starts the conversion process which lasts approximately 100 microseconds. At the conclusion of the conversion process, the Z3 A-TO-D converter sends an EOC signal from its INTR term on pin Z3-5 to the P25 input to the microprocessor at pin Z4-36 to signal that the conversion process is at an end.

The value of the conversion is made available to A-TO-D CONVERTER pins Z3-16 through Z3-11 inclusive and are received by the port 1 of the microprocessor at inputs P12 through Pl7 inclusive, pins Z4-29 through Z4-34 inclusive.

Figure 21:
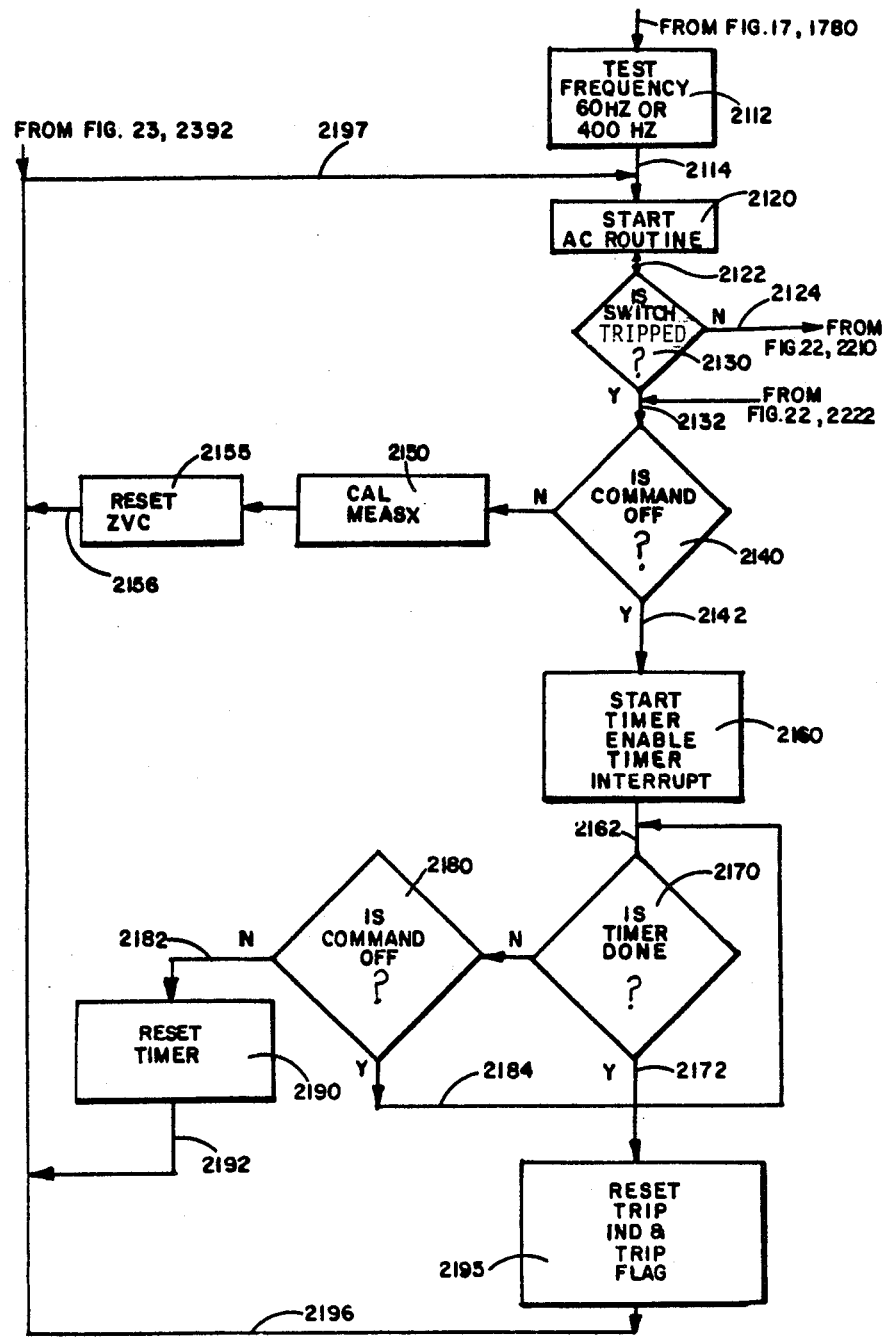

If the SSPC is selected to operate as an "ac" SSPC, the program exits the IS AC CONFIGURATION SELECTED? decision block 1770 and advances via the yes path 1780 to FIG. 21.

If the SSPC is selected to operate as a "dc" SSPC, the program exits the IS AC CONFIGURATION SELECTED? decision block 1770 and advances via path 1790 to 2110 on FIG. 21.

The program decides at decision block 1770 if the configuration is an ac or dc configuration and branches to the respective subprogram at entry point such as 2110 for the start of the ac flow diagram or to entry point 1810, the start of the dc operation flow diagram.

Figure 18:
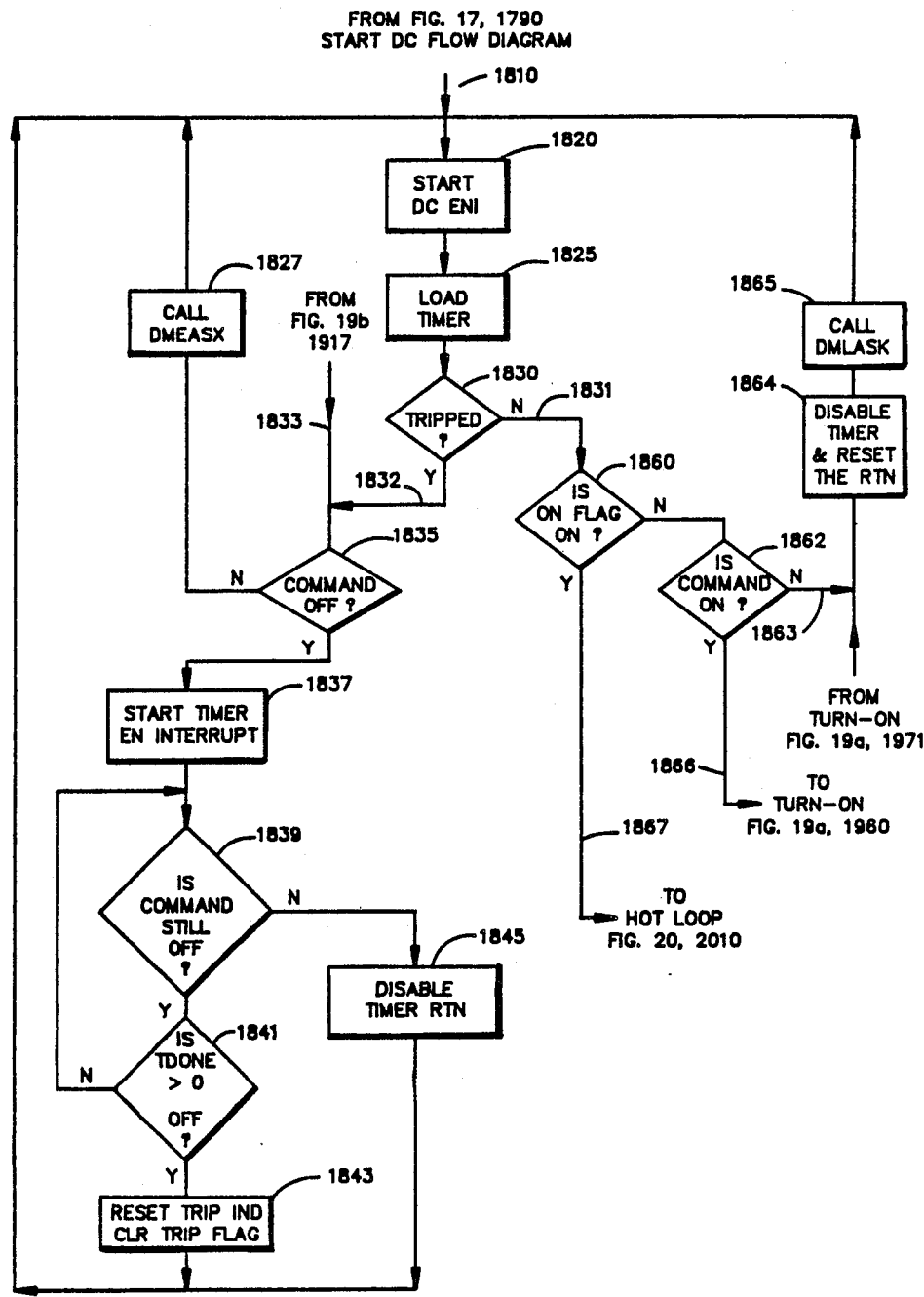

DC OPERATION FLOW CHART DISCUSSION, FIGS. 18, 19 and 20

If a determination is made at decision block 1770 that the controller operates with dc, the program advances via signal path 1790 to FIG. 18, at entry point 1810 and then to the START DC ENI block 1820 to enable the external interrupt to permit immediate interruption of the program by the occurrence of events such as a FAST TRIP signal. The program next advances to the LOAD TIMER block 1825. The value inserted in the timer will permit a proper evaluation of the COMMAND SIGNAL.

Referring to FIG. 11, the COMMAND SIGNAL is received at pin 32 of connector P1 with respect to P1-33. A high signal level turns on FET Q1-D shorting out the primary of transformer T2. In the absence of this shorted winding, FET Q2-C is clocked by a clock signal present on signal line 1110. Power is applied from the +5 V source to pins T2-8 and T2-7 by Q2-C switching on and off. R22 prevents inadvertent damage to Q2-C. The application of a switching voltage between T2-8 and T2-7 couples voltage to windings T2-4, 3; T2-2, 1; and T2-5, 6. The voltage on each of these secondaries develops in response to each turn-off of QZ-C. Magnetizing energy is used, as in a conventional fly-back converter to couple energy from the T2-8, 7 winding to each of the three secondaries.

Each of the three secondaries has a respective fly-back diode such as CR6, CR7, and CR8.

As Q1-D turns on in response to a COMMAND SIGNAL at P1-32, winding T2-2, 1 is clamped to a one-diode drop voltage level. This level is reflected to each of the remaining windings including T2-8, 7, the source of the signal. R22 is essential in limiting the energy transferred to this winding via Q2-C switching at the clock rate. The clamped level at winding T2-5, 6 results in a low voltage level being applied to an input of NOR gate Z7A at Z7-2. A low level into Z7A results in a high level out of NOR Z7A at Z7-3. The high level from Z7-3 is coupled to the P22 input to the microprocessor Z4, as shown in FIG. 10 at Z4-23.

Referring again to FIG. 18, the COMMAND signal must be present longer than a predetermined interval installed in the TIMER to be recognized as valid. The timer is typically set to permit 5.0 milliseconds to elapse. This process avoids having the SSPC respond to invalid noise transients on the COMMAND signal line.

The program next decides if the SSPC has been TRIPPED 1830. If it has, the program branches via signal path 1832 to diamond 1835 to decide if the COMMAND SIGNAL IS OFF. This condition is present in dc operation during the period after the SSPC has been tripped, before the fault has been cleared and the SSPC been reset by removal of the COMMAND signal and its reapplication.

Returning to the TRIPPED diamond 1830 of FIG. 18, if the program determines that the SSPC has not been tripped, the program advances via path 1831 to the ON FLAG ON diamond 1860. The program decides if the SSPC has been ON or OFF. If the SSPC has been OFF, the program branches via the YES path on signal path 1861 to diamond 1862 where the program determines if the COMMAND SIGNAL is ON or OFF. If the COMMAND signal is not ON, the program branches to the NO path 1863 to the DISABLE TIMER RTN block 1864. The timer is stopped by this operation, after which the program advances to the CALL DMEASX block 1865. This block represents an entry point and return from the current measurement process.

At the conclusion of the current measurement, the program advances to entry point 2-1, 1810 at the top of FIG. 18. The process characterized by the path of blocks 1820, 1825, 1830, 1860, 1862, 1864, 1865 and back to 1820 is therefore the path followed when the SSPC has not been tripped, the SSPC has not been on and a command signal is not present to turn the SSPC on; or, in the alternative, this path will be followed immediately after the COMMAND SIGNAL is applied and a bounce or low is detected in the leading edge of the COMMAND SIGNAL.

If the ON FLAG is ON, i.e., if the SSPC had connected dc power to the load at diamond 1860 in response to the COMMAND SIGNAL being ON, the program branches to the HOT LOOP sub-routine at entry point 2010 of FIG. 20.

Referring to FIG. 20, since the COMMAND SIGNAL for the SSPC for dc operation has been on, the program enters the HOT LOOP at block 2010 and then advances to the IS COMMAND ON diamond 2012 to determine if the COMMAND signal is present. If the COMMAND SIGNAL is not on, i.e., the COMMAND SIGNAL has just been turned off, the program advances to entry point 1910 for the DC TURN OFF routine at the top of FIG. 19b.

DC TURN OFF

The program advances into this sub-routine to turn-off or disconnect service from the load in response to the COMMAND signal being OFF from diamond 2012.

The turn-off sequence proceeds as the program enters the TURN OFF sub-routine at block 1910 and then advances to the START TIMER EN INTRPT block 1912. The timer EN is a timer used to measure how long the COMMAND signal has been OFF. The interval provided by this timer is a minimum OFF interval permissible to validate a turn-off. The COMMAND SIGNAL must be low or missing for an interval in excess of the interval established by the START TIMER EN interval, i.e. typically 1.0 millisecond.

The program advances to the CALL DMEASX block and exits to measure current and re-enters at block 1914. The program then advances to the IS TRIP FLAG ON ? decision block 1916. If the SSPC has not been tripped, the program advances to the IS TDONE 0 diamond 1920 to determine if the EN INTRPT timer is greater than zero signaling that the COMMAND SIGNAL has been off for a sufficiently long period of time to constitute a valid turn-off. If the timer has not exceeded zero, the program branches via path 1918 back to the CALL DMEASX block 1914 and continues to loop to diamond 1916 and to diamond 1920 until the timer does exceed zero.

As the timer exceeds zero, the program advances to the DRIVE OFF, CLEAR FO, CLEAR TDONE block 1922. This turns off the discrete output that commands the external ac switch on. The FO term is an internal bit that represents the ON FLAG. When it is cleared, the ON FLAG is OFF. The TDONE represents the ENTIMER register.

The program then returns to the normal dc operation entry point at 1810 on FIG. 18. If the program determined that a trip had not occurred at diamond 1830, that the ON FLAG was ON at diamond 1862, the HOT LOOP was entered at 2010 on FIG. 20 and if diamond 2012 determined that the COMMAND SIGNAL was ON, the program advances to diamond 2014 to determine if the SSPC has been tripped by an external interrupt, i.e. by a signal on a microprocessor port.

If an external trip has occurred, i.e. an external signal has been received by the microcomputer from external circuitry to signal that a FAST TRIP has occurred via an external interrupt signal to a port of the microcomputer Z4 (not shown), the program exits via path 2016 to the DTRIP entry block 2058 on FIG. 20, 2057. The sequence following this block is discussed later.

If an external trip has not occurred, the program advances to diamond 2018 in FIG. 20 to determine if an EOC (end of conversion) signal has been received by the MICROCOMPUTER from the ADC, Z3 characterized in FIG. 10. The EOC signal is received at MICROCOMPUTER pin Z4-36. After the EOC signal is received, the program exits diamond 2018 and advances to the RESTART ADC block 2020 in FIG. 20.

In response to entering block 2020, the MICROPROCESSOR, Z4 of FIG. 10 outputs a signal on port 2, line 6 at pin Z4-37 to the ADC pin Z3-3. This signal starts the next current measurement conversion and latches the last conversion reading on port 1 input lines P12 through P17, i.e. MICROCOMPUTER pins Z4-29 through Z4-34.

The program then advances to the READ ADC block 2022 and reads the last current amplitude latched onto the port 1 lines. The program then tests to determine if the dc current amplitude is in excess of the fast trip value in diamond 2024. If the measured current is not greater than the fast trip limit, the program advances to block 2026 to look up the square of the current value in a look-up table in memory and subtracts the value of KS selected by initialization via an input port line.

The KS selected is the value that determines the normal dc 100% current rating of the SSPC. The program then advances to diamond 2028. If the squared value of the current is greater than the KS value. If the squared current is not greater than KS, the program passes via path 2029 to the SUBT RESULTS block 2030. This block represents the steps required to subtract the value of the current squared minus the constant KS from the sum in the 24-bit accumulator used to accumulate current squared values. This routine ensures that there will be a simulated cool down after a short interval of operation in excess of rated load.

The program advances to diamond 2032 to determine if the 24-bit accumulator has a negative value. If the accumulator is not negative, the program returns to the start point at 1810 in FIG. 18 for another normal dc operation entry. If the accumulator is negative, the program zeros the accumulator via block 2034 and then returns to the FIG. 18 start location at 1810.

Returning now to FIG. 20, as if the program determines that the value of the current squared is greater than KS in diamond 2018, the program advances to the TRIPLE ADD block 2050. This block represents the process of adding the value of the current squared minus a constant from the 24-bit accumulator. This accumulator (not shown) is made up of three eight-bit accumulators connected in serial fashion. The results of overflow from a lower order right-bit register are coupled to the least significant bit of the next higher order register.

The program then advances to the COMPARE SEL ACCUM TO MXVALS block 2052. This block represents the process of comparing the value in the accumulator to a MAXVAL number. The MAXVAL number is typically a stored value that is selected via an external port line. This value is typically the limit to be applied. The program then advances to the IS ACC MAXVAL diamond 2055. The program branches via path 2054 to the HOT LOOP block and then to the entry point at the top of FIG. 20 at block 2010 if the value in the 24-bit accumulator is less than the MAXVAL limit. The program branches to the right via path 2057 to the DTRIP box 2058. This box represents the normal entry for an overcurrent trip. The program advances to the DRIVE OFF, TRIP ON, TRIP FLAG ON and ON FLAG OFF block 2060.

Referring to FIG. 18, the program exits the TRIPPED diamond 1830 via path 1832 after determining that the SSPC has been tripped and advances to the COMMAND OFF diamond 1835 to determine if the COMMAND signal has been removed for the purpose of resetting the SSPC. If the COMMAND signal has been removed, the program advances to the START TIMER EN INTRPT block 1837. The timer is used in this case to verify that the COMMAND signal has been off for a minimum of five milliseconds. The program advances from block 1837 to the IS COMMAND STILL OFF? diamond 1839. If the command is still off, the program advances to the IS TDONE GREATER THAN SYMBOL 0? OFF diamond 1841. If the TDONE timer is not greater than 0, the program returns to the entry point for diamond 1839. If the TDONE timer is greater than 0, the program advances to the RESET IND CLR FLAG block 1843. This block indicates that the computer clears the trip flag. After clearing the trip flag, the program returns to the normal entry point at 1810. If upon entering the IS COMMAND STILL OFF? diamond 1839, the program determines that the command signal is not still OFF, indicating that the command signal has again returned to the high state, the program advances to the DISABLE TIMER RTN block 1845. This block represents the program steps required to clear the timer and to advance back to the normal entry point at block 1810. The path via block 1845 is the path that the program would follow in the event that the command control failed to stay low long enough to be recognized as a valid reset.

DC TURN-ON

Figures 19A, 19B:
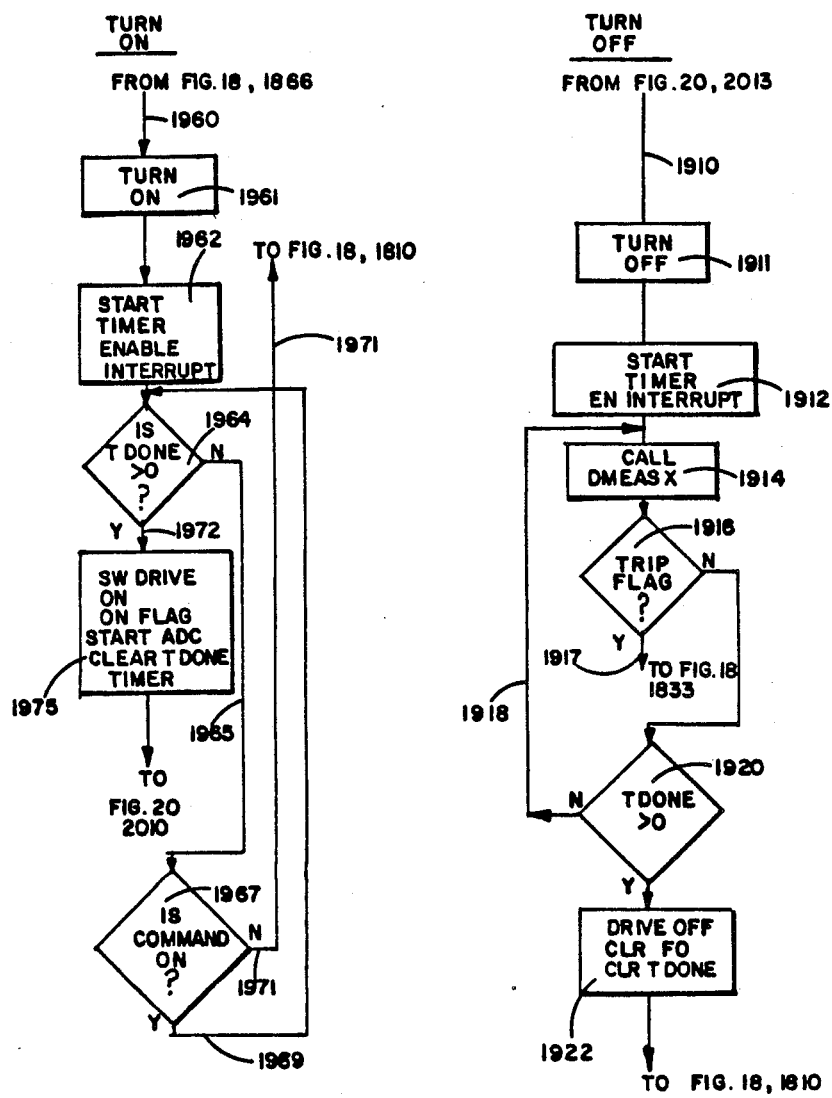

If the SSPC has not been tripped, the ON FLAG is not on and the command signal is turned on, the program advances from the normal entry point at 1810, through blocks 1820 and 1825 to diamond 1830, to diamond 1860 and finally to diamond 1862 to exit via YES path 1866 to the TURN ON block 1960 at FIG. 19a for an entry to the normal turn on sequence. The purpose of this sequence is to verify the validity of the command signal. The command signal is verified to be a valid command signal if the command signal remains true for more than five milliseconds without interruption.

Referring to FIG. 19a, after entering block 1960, the program advances to the START TIMER EN INTRPT block 1962. After starting the timer, the program advances to the TDONE>0? decision block 1964. If a five millisecond interval has not been exceeded, the program advances via path 1965 to the COMMAND ON? decision block 1967. If the command signal is on, the program advances via path 1969 back to diamond 1964 where the TDONE TIMER is again inspected to determine if it remains greater than 0. If the command signal is not on, the program branches via path 1971 to the normal entry point at 1810 on FIG. 18. This will result in clearing and restarting the start timer as the subroutine is re-entered at the TURN ON, thus ensuring that the command signal must be high for a full five milliseconds or it will not be verified as a valid command signal.

Referring to the TDONE diamond 1964 in FIG. 19a, if the timer value is determined to be greater than 0, the program advances via path 1972 to the SW DR ON, ON FLAG ON, START ADC, CLR TDONE TIMER block 1975. This block represents the steps of turning on the required discrete outputs to turn the SSPC dc electrical switch on and to apply dc power to the load. The program then advances to the HOT LOOP at FIG. 20, 2010.

Referring to FIG. 10, phantom blocks 1050, 1052 and 1054 represent circuitry that is not used with the core of an SSPC characterized for dc operation but which is used for an ac SSPC. Phantom blocks 1050 and 1052 contain circuitry used to produce +12 V and −12 V for use by the microprocessor and the precision regulator Z1 and the ADC Z3. The logic circuits such as Z9, Z8 and A5 along with logic circuits in FIG. 11, such as Z6 and Z7 use +5 V supplied from the output of the three terminal regulator Z1 at pin 3. FIG. 11 is a schematic of interface circuits used to communicate signals to and from the SSPC. The circuitry of FIG. 11 is present in both ac and dc applications.

AC OPERATION FLOW CHART DISCUSSION FIGS. 21, 22, 23 and 24

FIG. 21 represents the entry point of a flow chart for a solid state power control unit characterized for ac operation. The ac routine is entered at reference 2110 from FIG. 17 as shown at block 2112. Block 2112 represents the step of testing the frequency to determine if the ac line power is 60 cycle or 400 cycle power. This test is accomplished by measuring the time between zero crossing events characterized by the ZVC signal into the microprocessor 1006 from FET Q3D to the Z4-39 input as shown in FIG. 10. The start ac routine block 2120 is intended to designate an entry point for ac operation once initialization is complete. Block 2120 is entered via path 2114 from block 2112 or via path 2197 from blocks 2195 via 2196, block 2190 via 2192, block 2155 via 2156 and from block 2390 on FIG. 23 via 2392. These paths represent the various ways in which ac operation continues to reenter the start of the ac routine at block 2120 subsequent to initialization.

The program advances from block 2120 via 2122 to decision block 2130 to ask "IS THE SWITCH TRIPPED?". If the switch is not tripped, the program exits to FIG. 22 via path 2124 to enter decision block 2212. Decision block 2212 asks "IS THE FLAG ON?". The flag is on only if the command signal has been received in the past and the SSPC has applied power to the load. If the flag is on, the program exits the decision making block 2212 via path 2216 to the next decision making block in sequence, 2220 and asks the question "IS THE SSPC TRIPPED BY AN EXTERNAL INTERRUPT?". The program can be adapted to examine external port lines which can be set by external circuits or controls to indicate that the ac SSPC has been tripped. If the SSPC has not been tripped, the program exits decision making block 2220 via path 2224 and moves on to decision making block 2226 to ask "IS THE COMMAND SIGNAL ON?". If the electrical command signal is on, the program exits decision making block 2226 and advances to decision making block 2240 to ask the question "IS THE EOC TRUE?". The EOC signal is a signal that is received on an external port line from the A to D converter. The acronym EOC stands for "end of conversion". At the completion of a conversion, the analog to digital converter sends a true signal on the EOC signal line to the microcomputer 1006. If the EOC signal is not true, the program loops via signal path 2232 to path 2230 and reenters decision block 2240 until the EOC signal is true at which point the program advances via path 2242 to the restart ADC block 2250. The restart ADC block sends a signal via an external port line to the ADC to start a conversion after which the program advances to the READ ADC block 2260. The last value obtained by the ADC is stored in a latch register. The ADC value is read on port lines P12 through P17 of microcomputer 1006 as shown on FIG. 10. The value read from the ADC bus represents current amplitude I.

The program next advances to decision block 2280 and asks "IS I LESS THAN THE FAST TRIP LIMIT?". A YES answer causes the program to advance to decision making block 2290 to ask the question "IS THE DATA NEGATIVE?". The binary data is offset by the equivalent of 2.5 V with 5 V being full scale on the ADC. The 2.5 V offset represents a value of zero current. The most significant bit represents one-half of the full scale range of the ADC. A value of one followed by all zeros therefore represents a value of zero current. A value of one followed by all ones represents a maximum value of current and a value of zero represents that the maximum negative peak swing of current. If the data is not negative, then the program exits decision making block 2290 via the NO path to the mask MSB block 2295 to mask the most significant bit of the data obtained. If the data is negative, the program exits the decision making block 2290 via the YES path and advances to the REDUCE BINARY OFFSET block 2298. Block 2298 represents the step of adding or subtracting the required constant to remove the effect of the 2.5 V offset. The program exits block 2298 via path 2299 and transfers to entry point 2310 on FIG. 23. If the program determined that the data read was not negative at decision making block 2290, after the program had passed to the mask MSB block 2295, the program would next advance via path 2296, 2299 to path 2310 on FIG. 23 to decision making block 2320 to ask "IS I LESS THAN FULL SCALE?".

Figure 23:
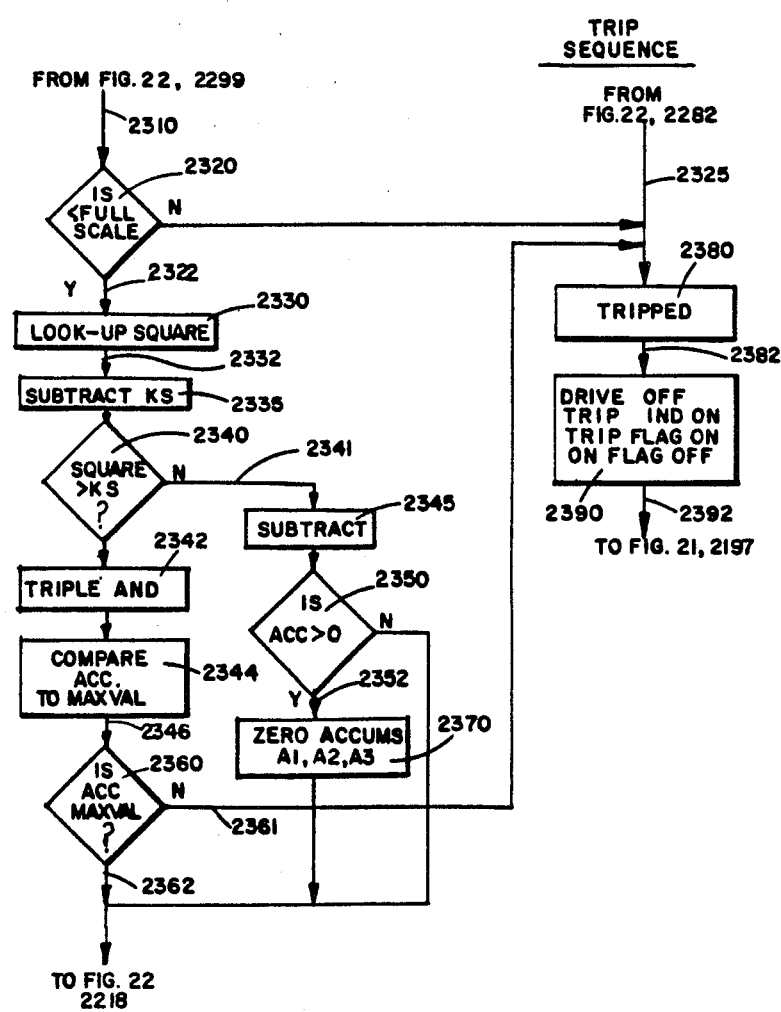

Referring to FIG. 23, if the subroutine decides at decision block 2320 that I, the magnitude of the current, is not less than full scale, the program exits decision block 2320 via the NO path, 2321 to enter the TRIPPED SUBROUTINE block 2380. Block 2380 is the entry point for all TRIP sequences to actually disconnect the load from the ac SSPC. The program advances from the entry to TRIPPED block 2380 via path 2382 to block 2390, titled "DRIVE OFF, TRIP IND ON, TRIP FLAG ON, ON FLAG OFF". These functions are achieved by the program by setting external port lines from the microprocessor. The program exits block 2390 via path 2392 and returns to entry point 2197 on FIG. 21.

Returning to decision block 2320, if the current is measured to be less than full scale, the program exits decision block 2320 via path 2322 to block 2330 titled "LOOK-UP SQUARE". This block signifies looking up the square of the current magnitude in a ROM table. This function is exited via path 2332 to the "SUBTRACT KS" block 2335. A constant KS is subtracted from the value representing the square of the current value read. The program exits block 2335 and proceeds to decision block 2340 at which point the subroutine determines if the resulting difference is negative or positive. A negative result indicates that the value of the current squared is less than the value of KS, the TRIP limit. If the difference is determined to be positive, the program exits decision block 2340 via path 2341 to block 2345 titled "SUBTRACT" at which point the previously determined resultant difference is subtracted from the triple precision accumulator ACC. The program next advances to decision block 2350 titled "IS ACC<0?". The process thus described is followed where the value in the ACC accumulator has resulted from a temporary overcurrent condition that was insufficient to result in a TRIP. A continuing series of subtractions of the value $I^2$ where $I^2$ is less than the rating of the SSPC as obtained at block 2345 results in a reduction of the accumulated sum in the ACC accumulator. This process achieves the same result obtainable by a thermal electric circuit breaker which having been subjected to a temporary overcurrent is allowed to cool down as current through the breaker is reduced to a level below the rating of the breaker. If the program determines that the value in the ACC register is less than 0, the program exits via the YES path 2352 to block 2370 titled "ZERO ACC UMS, A1, A2, A3". The program zeros the ACC accumulator as a result of entering this block and then advances via path 2372 to 2218 on FIG. 22. If a determination was made at decision block 2350 that ACC was not less than zero, the program would have advanced from that decision making block directly to 2218 on FIG. 22.

Referring again to decision block 2340 above, if the program determined that the value of $I^2$ was greater than KS, signifying that the value of current passing through the SSPC switch to the load was in excess of the rating from the SSPC, the program would advance via the YES path to block 2342 titled "TRIPLE AND". This block directs the computer to the triple precision ACC accumulator discussed earlier in connection with DC OPERATION. The program exits block 2342 via path 2343 to block 2344 titled "COMPARE ACC TO MAXVAL". The function of this block is to determine if the value of $I^2$ is in excess of the absolute limit established for FAST TRIP. The program exits block 2344 and advances to decision block 2360 titled "IS ACC EQUAL TO MAXVAL?". If the program determines that ACC equals MAXVAL, the program exits via the YES path 2362 to 2218, FIG. 22. If the program determines on the other hand that ACC is not equal to MAXVAL, the program exits via path 2361 to the TRIP sequence entry at 2325 via path 2361.

Referring again to FIG. 22 and in particular to block 2280 titled "IS I<FAST TRIP LIMIT?". A determination that I is not less than the FAST TRIP LIMIT implies that I has exceeded the FAST TRIP LIMIT. The program advances via path 2282 to 2325 on FIG. 23 which is the entry point for the TRIP sequence.

AC TURN-OFF

Figure 22:
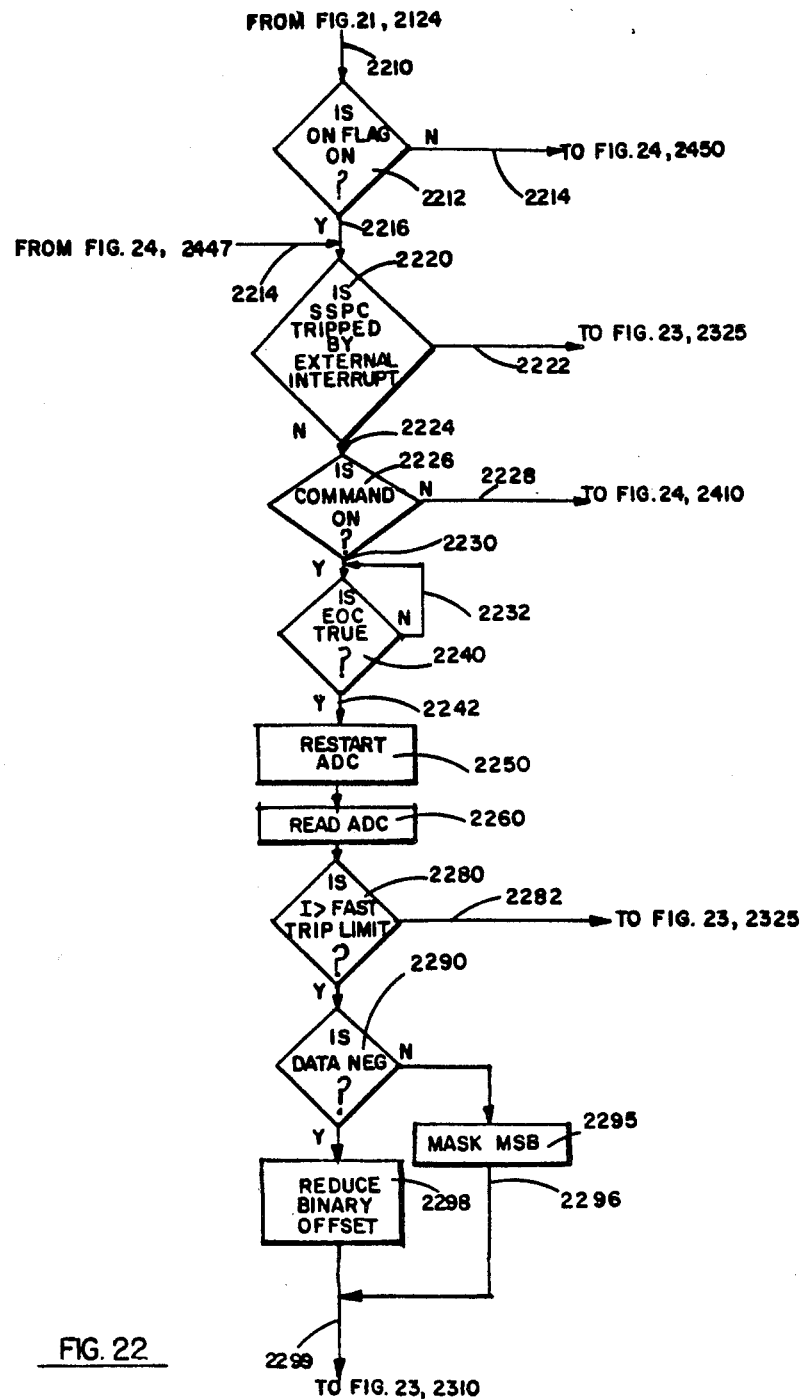
Figure 24:
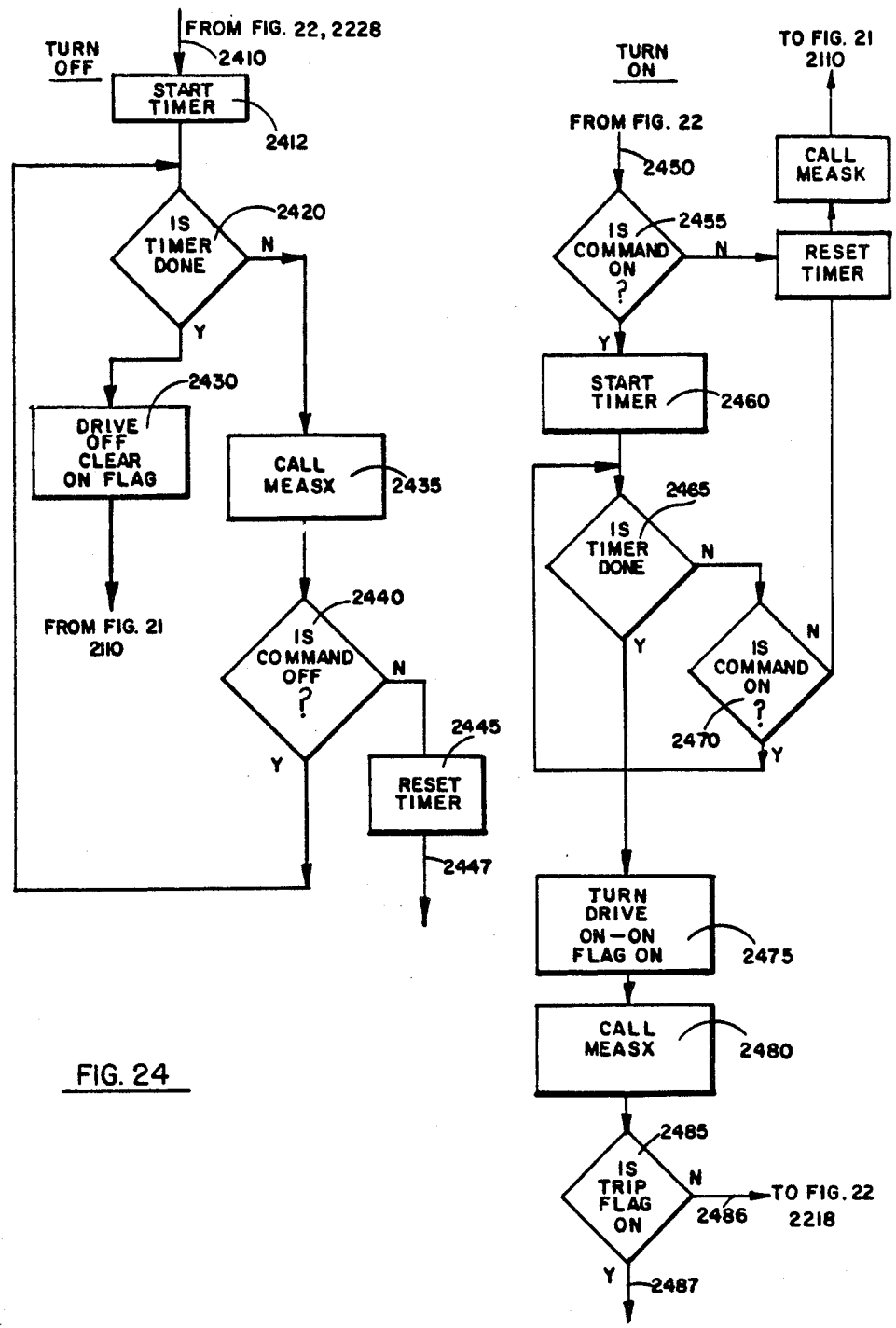

Referring to FIG. 22, as the program advances to decision block 2226, titled "IS COMMAND ON?" and determines by examining the respective external port that the COMMAND signal is not ON, the program transfers via path 2228 to path 2410 at the top of FIG. 24. Referring to FIG. 24, the TURN-OFF SEQUENCE begins by advancing to block 2412 titled "START TIMER". This block signifies starting a timer internal to the microprocessor for the purpose of validating removal of the control signal. The control signal must remain low for a predetermined time established by an internal timer before the TURN-OFF SEQUENCE will be validated and executed. The program advances from block 2412 to decision block 2420 titled "IS TIMER DONE?". If the timer has not reached the limit required for a proper TURN-OFF, the program exits via the NO path to block 2435 titled "CALL MEASX". This block signifies interrogating the last measured current value from the ADC. The program exits block 2435 and advances to decision making block 2440 titled "IS COMMAND OFF?" If a determination is made that the COMMAND signal is not OFF, the program exits the NO path to block 2445 titled "RESET TIMER". This path is followed where the COMMAND signal has been allowed to bounce or return to a high state, thus invalidating the TURN-OFF of the COMMAND SIGNAL. The program advances from block 2445 via path 2447 to path 2218 on FIG. 22 which is an entry point for the HOT LOOP. If the decision block 2440 results in a determination that the COMMAND signal is OFF, the program advances again to decision block 2420 titled "IS TIMER DONE?". The timer is again interrogated to determine if a sufficient time has passed to allow validation of the TURN OFF of the COMMAND SIGNAL. After sufficient time has passed and a determination is made that the timer is done, the program advances from decision block 2420 to block 2430 via the YES path. Block 2430 is titled "DRIVE OFF, CLEAR ON FLAG". The program is characterized to apply power to the load as the applied voltage crosses zero volts with a first sequence of polarity change, i.e. from − to + and the program removes the operating signal in response to a turn-off sequence as the applied voltage crosses zero with a second sequence of polarity change, i.e. + to −. This feature enables the SSPC to apply ac power to a magnetic load without the danger of high in-rush current due to an unreset magnetic core load. The program exits block 2430 to path 2110 on the top of FIG. 21 after resetting these internal flags.

Returning to FIG. 22, as the program advances to decision block 2220, titled "IS SSPC TRIPPED BY EXTERNAL INTERRUPT?" and determines that the program is tripped by an external interrupt, the program advances via path 2222 to path 2325 on FIG. 23, the TRIP SEQUENCE.

Referring to FIG. 21, as the program sequences past block 2160 to decision block 2170 titled "IS TIMER DONE?", and determines that the timer interval has not expired, the program exits via the NO path and advances to decision making block 2180 titled "IS COMMAND OFF?". If the program determines that the COMMAND signal is OFF by inspecting the respective input port, the program exits via path 2184 to entry path 2160 to decision making block 2170 to again ask "IS TIMER DONE?".

Referring to decision block 2180, if the program determines that the COMMAND signal is not OFF, indicating that the COMMAND signal is true, the program exits the NO path 2182 to block 2190 titled "RESET TIMER". At this point, the program resets the timer to zero and advances via path 2192 to the normal entry point for ac operation at 2110 at the top of FIG. 21.

Referring again to decision block 2170, if the decision making block 2170 determines that the timer has reached the limit of its range, a YES Determination is made and the program advances via path 2172 to block 2195 titled "RESET TRIP IND & TRIP FLAG". Subsequent to resetting these internal flags, the program advances via path 2196 to the normal entry point to the ac routine 2110 on FIG. 21.

Referring to FIG. 21 and to decision making block 2140, titled "IS COMMAND OFF?", if the program determines by inspecting the external port that relates to the COMMAND signal that the COMMAND signal is not OFF, indicating that it is ON, the program advances via the NO path to block 2150 titled "CALL MEASX". This subroutine measures the value of the current. The program exits block 2150 and advances to block 2155 titled "RESET ZVC". Tne program resets the zero voltage crossing flag and advances via path 2156 to the normal entry point for ac operation at 2114 at the top of FIG. 21.

What is claimed is:

1. A universal solid state power controller for controlling the application of a source voltage to a load under the control of a command electrical signal, resulting in the development of a load current in response to said command electrical signal comprising:
   a semiconductor switching means having a predetermined non-bounce switching characteristic, said switching means being responsive to a semiconductor switching means operating signal for connecting said load to said source voltage;
   control means having a microcomputer following a predetermined program and being responsive to said command electrical signal for providing said semiconductor switching means operating signal;
   said microcomputer program having an ac subprogram for SSPC operation with a source voltage of sinusoidal character and a dc subprogram for SSPC operation with a source voltage of direct current character;
   a voltage selection means for providing a logic signal of a first polarity to said microcomputer to direct said microcomputer to use said ac subprogram for SSPC operation with an ac source, said logic signal having a second polarity to direct said microcomputer to use said SSPC dc subprogram for operation with a dc source;
   a current rating selection means for providing at least one logic signal to said microcomputer to direct said microcomputer to select a predetermined current rating for said power controller;
   said semiconductor switch means being responsive to interruption of said semiconductor switching means operating signal to interrupt said conduction path source voltage to said load;
   said invention electrical switch provides a bounce-free closure of said conduction path from said alternating source voltage to said load in response to said command electrical signal, said closure corresponding with a first predetermined sequence of alternating source voltage crossing zero voltage having a first predetermined sequence of polarity change; and
   said invention electrical switch interrupts the conductive path to said load without contact bounce, associated arcing in response to interruption of said command electrical signal; said closure corresponding with a second predetermined sequence of alternating source voltage crossing zero voltage having a second predetermined sequence of polarity change.

2. The combination in accordance with claim 1, wherein said electrical switch further comprises:
   load current sensing means interposed in series with said load current conduction path for providing a current amplitude signal,
   said control means being responsive to said current amplitude signal for comparing said current amplitude signal with a first predetermined current amplitude threshold limit,
   said control means being responsive to said current amplitude signal exceeding said first predetermined current amplitude threshold limit for providing a fast trip signal,
   said control means being responsive to said fast trip signal to interrupt said operating signals for said semiconductor switching means and said electromechanical switching means, whereby, said semiconductor switching means and said electromechanical switching means interrupting said load current path to said load.

3. The combination in accordance with claim 2, wherein said load current sensing means further comprises:
means for converting said current amplitude signal into a digital current amplitude signal,
said control means being responsive to said digital current amplitude signal for comparing said digital current amplitude signal with a first predetermined digital current amplitude threshold limit, said control means being responsive to said digital current amplitude signal exceeding said first predetermined digital current amplitude threshold limit for providing a normal trip signal to interrupt said semiconductor switching means operating signal.

4. The combination in accordance with claim 3, wherein said control means microcomputer further includes:
a first accumulator,
said predetermined microcomputer program being characterized as commanding said microcomputer to perform the steps of
sampling said digital current amplitude signal,
squaring each said sampled digital current amplitude signal,
adding each said squared digital current amplitude signal to said accumulator,
subtracting a first predetermined constant from said accumulator after each addition of said sampled squared digital current amplitude signal,
comparing said accumulator value with a second predetermined constant,
providing a normal trip signal in response to said accumulator value exceeding said second predetermined constant,
said control means being responsive to said normal trip signal to interrupt said operating signals for said semiconductor switching means and said electromechanical switching means,
whereby said semiconductor switching means and said electromechanical switching means interrupt said load current conduction path to said load.

5. The combination in accordance with claim 2, wherein said load current sensing means interposed in series with said load current conduction path is characterized as providing a squared current amplitude signal proportional to the square of the load current,
said control means being responsive to said squared current amplitude signal, and is further adapted to compare said squared current amplitude signal with a first predetermined current amplitude threshold limit,
said control means being responsive to said squared current amplitude signal exceeding said first predetermined current amplitude threshold limit for providing a fast trip signal,
said control means being responsive to said fast trip signal to interrupt said operating signals for said semiconductor switching means and said electromechanical switching means,
whereby said semiconductor switching means and said electromechanical switching means interrupt said load current path to said load.

6. The combination in accordance with claim 5, wherein said load current sensing means further comprises:
means for converting said squared current amplitude signal into a sampled squared digital current amplitude signal, said control means being responsive to said sampled squared digital current amplitude signal for comparing each said sampled squared digital current amplitude signal with a first predetermined squared digital current amplitude threshold limit, said control means being responsive to said sampled squared digital current amplitude signal exceeding said first predetermined squared digital current amplitude threshold for providing said fast trip signal.

7. The combination in accordance with claim 6, wherein said control means microcomputer further includes:
a first accumulator,
said predetermined microcomputer program being to perform the steps of
sampling said squared digital current amplitude signal,
adding each said squared digital current amplitude signal to said accumulator,
subtracting a first predetermined constant from said accumulator after each said addition of said sampled squared digital current amplitude signal,
comparing said accumulator value with a second predetermined constant,
providing a normal trip signal in response to said accumulator value exceeding said second predetermined constant, said control means being responsive to said normal trip signal to interrupt said operating signals for said semiconductor switching means and said electromechanical switching means,
whereby said semiconductor switching means and said electromechanical switching means interrupt said load current conduction path to said load.

8. The combination in accordance with claim 7, wherein said control means microcomputer repetitively executes said predetermined program,
said predetermined program being characterized to control said microcomputer to control said control means to sequence through steps in response to the concurrence of a command electrical signal and a fast trip signal or the concurrence of a command electrical signal and a normal trip signal;
to first, provide said semiconductor switching means operating signal;
to second, establish a conductive first conduction path from said alternating source voltage to aid load, said conducting first conduction path acting to share current with said load contact;
to third, interrupt said operating signal to said electromechanical switching means;
to fourth, respond to loss of said contact closed position signal signalling opening of aid load contact by interrupting said semiconductor switching means operating signal,
whereby said conducting first conduction path becomes non-conductive, thereby preventing failure.

9. The combination in accordance with claim 8, wherein said semiconductor switching means is further comprised of diode blocked anti-parallel transistors.

10. The combination in accordance with claim 8, wherein said semiconductor switching means is further comprised of a TRIAC.

11. The combination in accordance with claim 10, wherein said control means being responsive to interruption of said electrical command signal to interrupt said semiconductor switching means operating signal is further adapted to delay said interruption by approximately ¾ cycle measured from said source voltage crossing zero voltage having a first predetermined sequence of polarity change.

12. The combination in accordance with claim 8, wherein said semiconductor switching means is further comprised of anti-parallel silicon controlled rectifiers.

13. The combination in accordance with claim 12, wherein said control means being responsive to interruption of said electrical command signal to interrupt said semiconductor switching means operating signal is further adapted to delay said interruption by approximately ¾ cycle measured from said source voltage crossing zero voltage having a first predetermined sequenc of polarity change.

14. The combination in accordance with claim 1, wherein said voltage selection means further comprises:
   a predetermined printed circuit connection characterized to provide a logic signal having a first polarity to a microcomputer port to characterize the SSPC for ac operation; and
   a second polarity to characterize said SSPC for dc operation.

15. The combination in accordance with claim 1 further comprising:
   a zero crossing circuit for sensing said voltage source, said zero crossing circuit providing zero crossing signals to a microcomputer input port in response to said voltage source being an ac source and periodically crossing zero voltage.

16. The combination in accordance with claim 15, wherein said microcomputer program automatically selects the SSPC subprogram for ac operation where zero crossing signals are determined by said microcomputer to be present.

17. The combination in accordance with claim 15, wherein said microcomputer program is characterized to measure the time between zero crossing signals and to calculate the frequency of said voltage source from said time measurements.

18. A universal solid state power controller for controlling the application of a source voltage to a load under the control of a command electrical signal, resulting in the development of a load current in response to said command electrical signal comprising:
   a semiconductor switching means having a predetermined non-bounce switching characteristic, said switching means being responsive to a semiconductor switching means operating signal for connecting said load to said source voltage;
   control means having a microcomputer following a predetermined program and being responsive to said command electrical signal for providing said semiconductor switching means operating signal;
   said microcomputer program having an ac subprogram for SSPC operation with a source voltage of sinusoidal character and a dc subprogram for SSPC operation with a source voltage of direct current character;
   a voltage selection means for providing a logic signal of a first polarity to said microcomputer to direct said microcomputer to use said ac subprogram for SSPC operation with an ac source, said logic signal having a second polarity to direct said microcomputer to use said SSPC dc subprogram for operation with a dc source;
   said semiconductor switch means being responsive to interruption of said semiconductor switching means operating signal to interrupt said conduction path source voltage to said load;
   said invention electrical switch provides a bounce-free closure of said conduction path from said alternating source voltage to said load in response to said command electrical signal, said closure corresponding with a first predetermined sequence of alternating source voltage crossing zero voltage having a first predetermined sequence of polarity change; and
   said invention electrical switch interrupts the conductive path to said load without contact bounce, associated arcing in response to interruption of said command electrical signal; said closure corresponding with a second predetermined sequence of alternating source voltage crossing zero voltage having a second predetermined sequence of polarity change.

* * * * *